(12) United States Patent
Yasuda et al.

(10) Patent No.: US 12,497,363 B2
(45) Date of Patent: Dec. 16, 2025

(54) ISOPHTHALONITRILE COMPOUND, LUMINESCENT MATERIAL AND LUMINESCENT ELEMENT USING THE SAME

(71) Applicants: KYUSHU UNIVERSITY, NATIONAL UNIVERSITY CORPORATION, Fukuoka (JP); Nippon Soda Co., Ltd., Tokyo (JP)

(72) Inventors: Takuma Yasuda, Fukuoka (JP); Minlang Yang, Fukuoka (JP); In Seob Park, Fukuoka (JP); Katsunori Tanaka, Odawara (JP); Yasuhiro Miyashita, Odawara (JP); Yasuhiko Ashikari, Odawara (JP)

(73) Assignees: Kyushu University, National University Corporation, Fukuoka (JP); Nippon Soda Co., Ltd, Tokyo (JP)

( * ) Notice: Subject to any disclaimer, the term of this patent is extended or adjusted under 35 U.S.C. 154(b) by 779 days.

(21) Appl. No.: 17/616,127

(22) PCT Filed: Jun. 8, 2020

(86) PCT No.: PCT/JP2020/022547
§ 371 (c)(1),
(2) Date: Dec. 2, 2021

(87) PCT Pub. No.: WO2020/250851
PCT Pub. Date: Dec. 17, 2020

(65) Prior Publication Data
US 2022/0242822 A1    Aug. 4, 2022

(30) Foreign Application Priority Data

Jun. 14, 2019    (JP) ................................ 2019-111304

(51) Int. Cl.
| | |
|---|---|
| C07D 209/86 | (2006.01) |
| C07D 403/04 | (2006.01) |
| C07D 403/10 | (2006.01) |
| C09K 11/06 | (2006.01) |
| H10K 50/11 | (2023.01) |
| H10K 85/60 | (2023.01) |

(52) U.S. Cl.
CPC ......... *C07D 209/86* (2013.01); *C07D 403/04* (2013.01); *C07D 403/10* (2013.01); *C09K 11/06* (2013.01); *H10K 50/11* (2023.02); *H10K 85/6572* (2023.02); *C09K 2211/1029* (2013.01)

(58) Field of Classification Search
None
See application file for complete search history.

(56) References Cited

U.S. PATENT DOCUMENTS

| | | | |
|---|---|---|---|
| 2009/0206745 A1 | 8/2009 | Hwang et al. | |
| 2015/0105564 A1 | 4/2015 | Adachi et al. | |
| 2016/0072076 A1 | 3/2016 | Stoessel et al. | |
| 2016/0164000 A1* | 6/2016 | Li | H01L 51/0072 |
| 2018/0291264 A1* | 10/2018 | Lee | C09K 11/06 |
| 2020/0203621 A1* | 6/2020 | Kim | H01L 51/0067 |
| 2020/0227651 A1 | 7/2020 | Notsuka et al. | |

FOREIGN PATENT DOCUMENTS

| | | |
|---|---|---|
| CN | 107652225 A | 2/2018 |
| CN | 108264478 A | 7/2018 |
| JP | 2016-516085 A | 6/2016 |
| JP | 2019-006988 A | 1/2019 |

(Continued)

OTHER PUBLICATIONS

English translation of KR 20190062250 and the original KR 20190062250, Jun. 5, 2019, Hong et al. (Year: 2019).*

(Continued)

*Primary Examiner* — Seokmin Jeon

(74) *Attorney, Agent, or Firm* — Fitch, Even, Tabin & Flannery LLP

(57) ABSTRACT

Provided are compounds represented by, for example, formula (1) (wherein $R^1$, $R^2$, $R^3$ and $R^4$ each independently represent a hydrogen atom, an alkyl group, or a heteroaryl group, not all of $R^1$, $R^2$, $R^3$ and $R^4$ being hydrogen atoms), a luminescent material including at least one compound selected from among the compounds, and a luminescent element including the luminescent material.

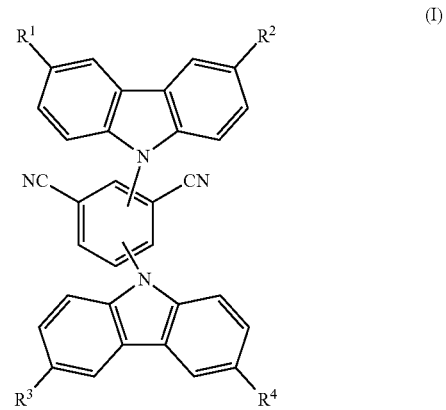

(I)

3 Claims, 6 Drawing Sheets

(56) References Cited

FOREIGN PATENT DOCUMENTS

| KR | 10-2019-062250 A | 6/2019 |
|---|---|---|
| KR | 10-2019-049525 A | 9/2019 |
| TW | 1376383 B | 11/2012 |
| WO | WO-2013/154064 A1 | 10/2013 |
| WO | WO-2015/199303 A1 | 12/2015 |
| WO | WO-2018/237389 A1 | 12/2018 |
| WO | WO-2019/004254 A1 | 1/2019 |
| WO | WO-2019/195104 A1 | 10/2019 |

OTHER PUBLICATIONS

English translation of CN 108264478 A and the original CN 108264478 A, Jul. 10, 2018, Duan et al. (Year: 2018).*
Dongdong Zhang et al. "Sterically shielded blue thermally activated delayed fluorescence emitters with improved efficiency and stability", Mater. Horiz. 2016, vol. 3, p. 145-151 (Year: 2016).*
Hyeong Min Kim et al. "Effect of donor and acceptor position on light emitting performances of thermally activated delayed fluorescent emitters with two bicarbazole donors and two cyano acceptors" Syn. Metals 2017, vol. 227, p. 37-42 (Year: 2017).*
Hyeong Min Kim et al. "Blue thermally activated delayed fluorescent emitters having a bicarbazole donor moiety" RSC Adv. 2016, vol. 6, p. 64133 (Year: 2016).*
International Search Report dated Aug. 11, 2020 in PCT/JP2020/022547, with English translation.
Office Action and Search Report dated Apr. 6, 2021 in TW 109119133, with translation of Search Report.
Office Action dated Jul. 6, 2023 in KR 10-2021-7038904, with English translation.
Oh et al., "Relationship between molecular structure and dipole orientation of thermally activated delayed fluorescent emitters," Organic Electronics, 2017 (online Dec. 28, 2016), 42:337-342.
Partial Supplemental European Search Report dated Aug. 7, 2023 in EP 20823145.6.

* cited by examiner

ISOPHTHALONITRILE COMPOUND, LUMINESCENT MATERIAL AND LUMINESCENT ELEMENT USING THE SAME

TECHNICAL FIELD

The present invention relates to an isophthalonitrile compound, a luminescent material and a luminescent element using the same. In further detail, the present invention relates to an isophthalonitrile compound in which the chirality based on a spiral structure is stable and luminescent characteristics are excellent, a luminescent material and a luminescent element using the same.

The present invention claims priority on the basis of Japanese Patent Application No. 2019-111304 filed in Japan on Jun. 14, 2019, the contents of which are incorporated herein by reference.

BACKGROUND OF THE INVENTION

Various luminescent materials used in an organic luminescent element have been proposed. For example, Patent Document 1 discloses a compound of formula (A).

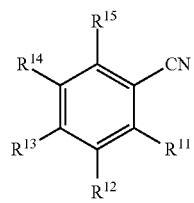

(A)

In the formula (A), at least one of $R^{11}$ to $R^{15}$ is a cyano group, at least one of $R^{11}$ to $R^{15}$ is a group of formula (A1), and the remaining groups of $R^{11}$ to $R^{15}$ are a hydrogen atom or a substituent.

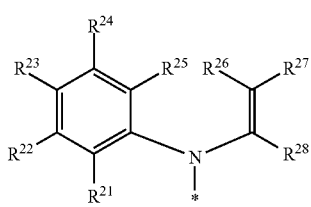

(A1)

In the formula (A1), $R^{21}$ to $R^{28}$ are each independently a hydrogen atom or a substituent. $R^{25}$ and $R^{26}$ may form together a single bond, and $R^{27}$ and $R^{28}$ may form together a substituted or unsubstituted benzene ring with carbon atoms to which $R^{27}$ and $R^{28}$ are bonded.

Patent Document 2 discloses a compound of formula (B).

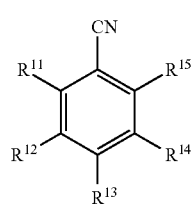

(B)

In the formula (B), $R^{11}$ to $R^{15}$ are each independently a hydrogen atom or a substituent. One of $R^{11}$ to $R^{15}$ is a cyano group. One to three of $R^{11}$ to $R^{15}$ are an aryl group Ar which may be substituted with an alkyl group or an aryl group (although a benzene ring constituting the former aryl group may be condensed with a ring which may contain an oxygen atom or a sulfur atom in addition to carbon atoms as a ring-constituting atom, the benzene ring is not condensed with a ring containing a hetero atom other than an oxygen atom or a sulfur atom as a ring-constituting atom). In the case where at least two of $R^{11}$ to $R^{15}$ are Ar, Ar may be identical to or different from each other. One to three of $R^{11}$ to $R^{15}$ are a donor group D (provided that a group corresponding to Ar is excluded). In the case where at least two of $R^{11}$ to $R^{15}$ are the group D, the group D may be identical to or different from each other.

DOCUMENTS OF RELATED ART

Patent Documents

Patent Document 1: WO 2013/154064 A1
Patent Document 2: WO 2019/004254 A1

SUMMARY OF THE INVENTION

Problems to be Solved by the Invention

The aims of the present invention are to provide an isophthalonitrile compound having excellent luminescent characteristics, a luminescent material and a luminescent element using the same.

Means to Solve the Problems

As a result of intensive studies to solve the above problems, the present invention including the following aspects has been completed.

(1) A compound of formula (I), formula (II) or formula (III).

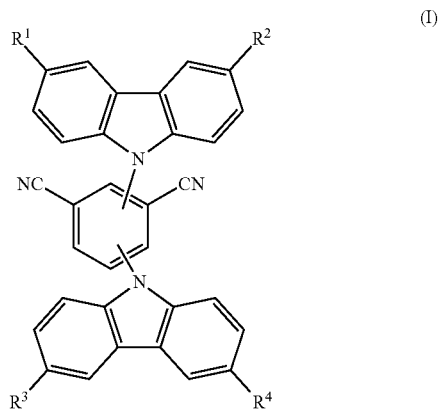

(I)

In the formula (I),
$R^1$, $R^2$, $R^3$ and $R^4$ are each independently a hydrogen atom, an alkyl group, or a heteroaryl group, and at least one of $R^1$, $R^2$, $R^3$ and $R^4$ is not a hydrogen atom.

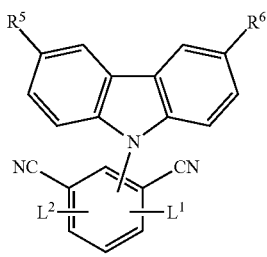

(II)

In the formula (II),
$R^5$ and $R^6$ are each independently a hydrogen atom, an alkyl group, an aryl group, or a heteroaryl group, and at least one of $R^5$ and $R^6$ is not a hydrogen atom, and
$L^1$ and $L^2$ are each independently an aryl group.

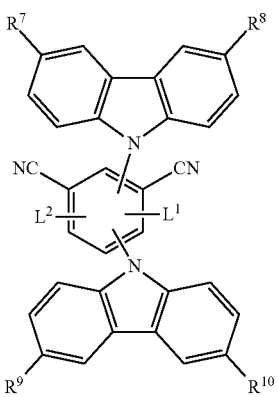

(III)

In the formula (III),
$R^7$, $R^8$, $R^9$ and $R^{10}$ are each independently a hydrogen atom, an aryl group, or a heteroaryl group, at least one of $R^7$, $R^8$, $R^9$ and $R^{10}$ is not a hydrogen atom, and
$L^1$ and $L^2$ are each independently an aryl group.

(2) A luminescent material containing at least one selected from the compounds of (1).
(3) A luminescent element containing the luminescent material of (2).

Effects of the Invention

The isophthalonitrile compound according to the present invention is useful as a luminescent material. The luminescent element containing the luminescent material according to the present invention can realize excellent luminescent efficiency.

EMBODIMENTS FOR CARRYING OUT THE INVENTION

Figure 1:
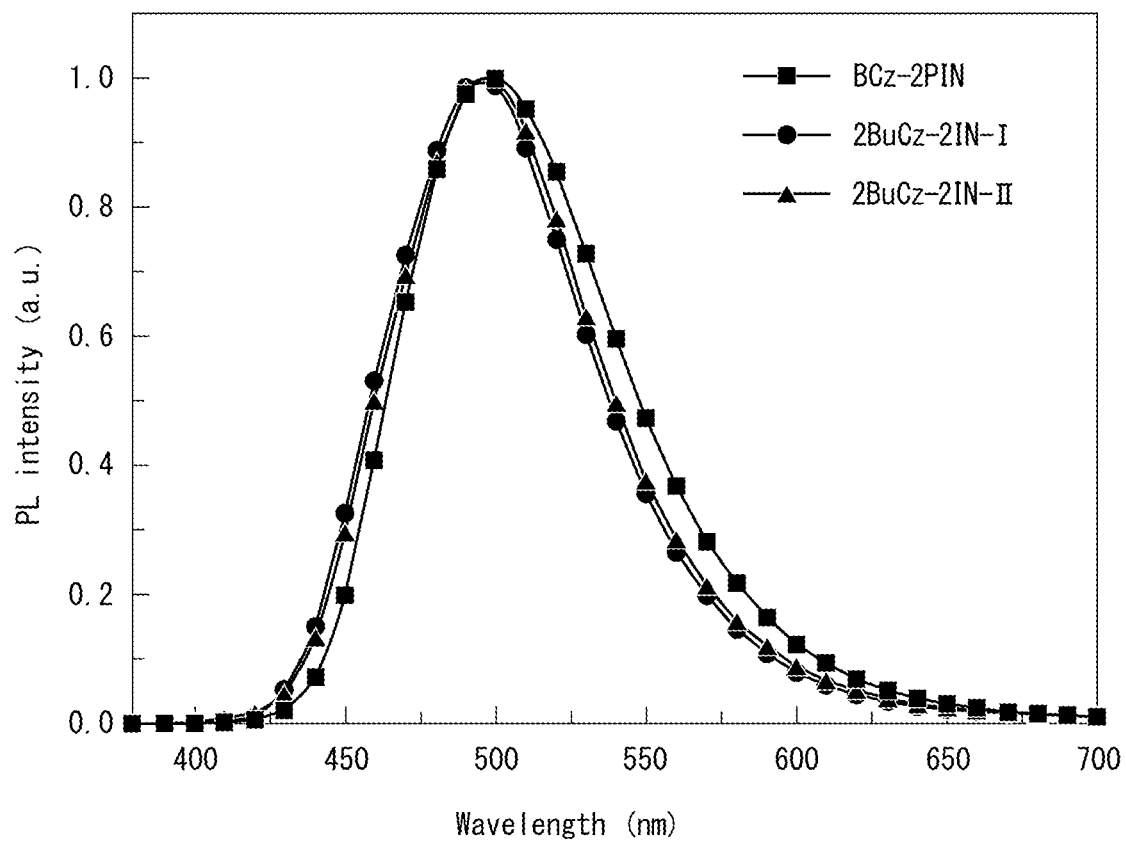
FIG. 1 is a drawing that indicates PL spectra of toluene solutions prepared in Example 4.

The isophthalonitrile compound according to the present invention is a compound of formula (I), formula (II) or formula (III).

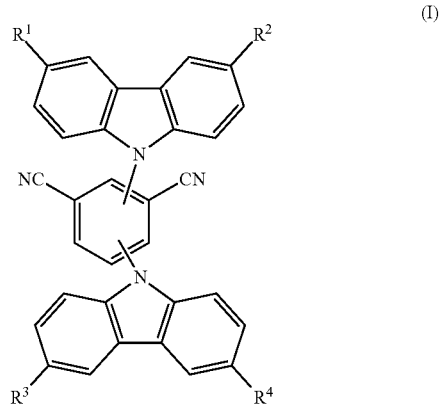

(I)

In the formula (I), $R^1$, $R^2$, $R^3$ and $R^4$ are each independently a hydrogen atom, an alkyl group, or a heteroaryl group, and at least one of $R^1$, $R^2$, $R^3$ and $R^4$ is not a hydrogen atom.

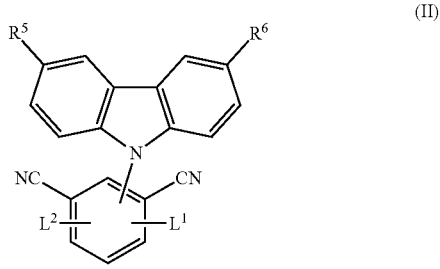

(II)

In the formula (II), $R^5$ and $R^6$ are each independently a hydrogen atom, an alkyl group, an aryl group, or a heteroaryl group, and at least one $R^5$ and $R^6$ is not a hydrogen atom.

In the formula (II), $L^1$ and $L^2$ are each independently an aryl group.

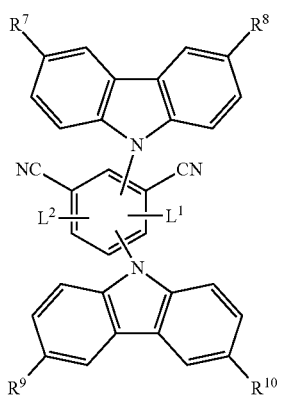

(III)

In the formula (III), $R^7$, $R^8$, $R^9$ and $R^{10}$ are each independently a hydrogen atom, an aryl group, or a heteroaryl group, and at least one of $R^7$, $R^8$, $R^9$ and $R^{10}$ is not a hydrogen atom.

In the formula (III), $L^1$ and $L^2$ are each independently an aryl group.

In the present invention, the term "unsubstituted" refers to a group consisting of a mother nucleus. In the case where only the name of a group serving as a mother nucleus is provided, this refers to "unsubstituted" unless specifically indicated otherwise.

On the other hand, the term "substituted" refers to any hydrogen atom of a group serving as a mother nucleus being substituted with a group having a structure that is identical to or different from the mother nucleus. Thus, a "substituent" is another group bound to a group serving as the mother nucleus. There may be one substituent or two or more substituents. Two or more substituents may be identical to or different from each other.

There are no particular limitations on "substituents" provided that they are chemically acceptable and achieve the effects of the present invention.

Typical examples of groups that can be "substituents" include the following groups:

halogeno groups such as a fluoro group, a chloro group, a bromo group, and an iodo group;

C1-6 alkyl groups such as a methyl group, an ethyl group, a n-propyl group, an i-propyl group, a n-butyl group, a s-butyl group, an i-butyl group, a t-butyl group, a n-pentyl group, and a n-hexyl group;

C2-6 alkenyl groups such as a vinyl group, a 1-propenyl group, a 2-propenyl group, a 1-butenyl group, a 2-butenyl group, a 3-butenyl group, a 1-methyl-2-propenyl group, a 2-methyl-2-propenyl group, a 1-pentenyl group, a 2-pentenyl group, a 3-pentenyl group, a 4-pentenyl group, a 1-methyl-2-butenyl group, a 2-methyl-2-butenyl group, a 1-hexenyl group, a 2-hexenyl group, a 3-hexenyl group, a 4-hexenyl group, and a 5-hexenyl group;

C2-6 alkynyl groups such as an ethynyl group, a 1-propynyl group, a 2-propynyl group, a 1-butynyl group, a 2-butynyl group, a 3-butynyl group, a 1-methyl-2-propynyl group, a 2-methyl-3-butynyl group, a 1-pentynyl group, a 2-pentynyl group, a 3-pentynyl group, a 4-pentynyl group, a 1-methyl-2-butynyl group, a 2-methyl-3-pentynyl group, a 1-hexynyl group, and a 1,1-dimethyl-2-butynyl group;

C3-8 cycloalkyl groups such as a cyclopropyl group, a cyclobutyl group, a cyclopentyl group, a cyclohexyl group, a cycloheptyl group, and a cubanyl group;

C3-8 cycloalkenyl groups such as a 2-cyclopropenyl group, a 2-cyclopentenyl group, a 3-cyclohexenyl group, and a 4-cyclooctenyl group;

C6-10 aryl groups such as a phenyl group and a naphthyl group;

5-membered heteroaryl groups such as a pyrrolyl group, a furyl group, a thienyl group, an imidazolyl group, a pyrazolyl group, an oxazolyl group, an isoxazolyl group, a thiazolyl group, an isothiazolyl group, a triazolyl group, an oxadiazolyl group, a thiadiazolyl group, and a tetrazolyl group;

6-membered heteroaryl groups such as a pyridyl group, a pyrazinyl group, a pyrimidinyl group, a pyridazinyl group, and a triazinyl group;

condensed heteroaryl groups such as an indolyl group, a benzofuryl group, a benzothienyl group, a benzoimidazolyl group, a benzoxazolyl group, a benzothiazolyl group, a quinolyl group, an isoquinolyl group, and a quinoxalinyl group;

cyclic ether groups such as an oxiranyl group, a tetrahydrofuryl group, a dioxolanyl group, and a dioxlanyl group;

cyclicamino groups such as an aziridinyl group, a pyrrolidinyl group, a piperidyl group, a piperazinyl group, and a morpholinyl group;

a hydroxyl group; an oxo group;

C1-6 alkoxy groups such as a methoxy group, an ethoxy group, a n-propoxy group, an i-propoxy group, a n-butoxy group, a s-butoxy group, an i-butoxy group, and a t-butoxy group;

C2-6 alkynyloxy groups such as a vinyloxy group, an allyloxy group, a propenyloxy group, and a butenyloxy group;

C2-6 alkynyloxy groups such as an ethynyloxy group, and a propargyloxy group;

C6-10 aryloxy groups such as a phenoxy group, and a naphthoxy group;

5- to 6-membered heteroaryloxy groups such as a thiazolyloxy group, and a pyridyloxy group;

a carboxyl group;

a formyl group; C1-6 alkylcarbonyl groups such as an acetyl group, and a propionyl group;

a formyl group; C1-6 alkylcarbonyloxy groups such as an acetyloxy group, and a propionyloxy group;

C1-6 alkoxycarbonyl groups such as a methoxycarbonyl group, an ethoxycarbonyl group, a n-propoxycarbonyl group, an i-propoxycarbonyl group, a n-butoxycarbonyl group, and a t-butoxycarbonyl group;

C1-6 haloalkyl groups such as a chloromethyl group, a chloroethyl group, a trifluoromethyl group, a 1,2-dichloro-n-propyl group, a 1-fluoro-n-butyl group, and a perfluoro-n-pentyl group;

C2-6 haloalkynyl groups such as a 2-chloro-1-propenyl group, and a 2-fluoro-1-butenyl group;

C2-6 haloalkynyl groups such as a 4,4-dichloro-1-butynyl group, a 4-fluoro-1-pentynyl group, and a 5-bromo-2-pentynyl group;

C3-6 halocycloalkyl groups such as a 3,3-difluorocyclobutyl group;

C1-6 haloalkoxy groups such as a 2-chloro-n-propoxy group, a 2,3-dichlorobutoxy group, a trifluoromethoxy group, and a 2,2,2-trifluoroethoxy group;

C2-6 haloalkenyloxy groups such as a 2-chloropropenyloxy group, and a 3-bromobutenyloxy group;

C1-6 haloalkylcarbonyl groups such as a chloroacetyl group, a trifluoroacetyl group, and a trichloroacetyl group;
a cyano group; a nitro group; an amino group;
C1-6 alkylamino groups such as a methylamino group, a dimethylamino group, and a diethylamino group;
C6-10 arylamino groups such as an anilino group, and a naphthylamino group;
a formylamino group; C1-6 alkylcarbonylamino groups such as an acetylamino group, a propanoylamino group, a butyrylamino group, and an i-propylcarbonylamino group;
C1-6 alkoxycarbonylamino groups such as a methoxycarbonylamino group, an ethoxycarbonylamino group, a n-propoxycarbonylamino group, and an i-propoxycarbonylamino group;
C1-6 alkylsulfoximino groups such as a S, S-dimethylsulfoximino group;
an aminocarbonyl group;
C1-6 alkylaminocarbonyl groups such as a methylaminocarbonyl group, a dimethylaminocarbonyl group, an ethylaminocarbonyl group, and an i-propylaminocarbonyl group;
imino C1-6 alkyl groups such as an iminomethyl group, a (1-imino) ethyl group, and a (1-imino)-n-propyl group;
hydroxyimino C1-6 alkyl groups such as a hydroxyiminomethyl group, a (1-hydroxyimino)ethyl group, and a (1-hydroxyimino)propyl group;
C1-6 alkoxyimino C1-6 alkyl group such as a methoxyiminomethyl group, and a (1-methoxyimino) ethyl group;
a mercapto group;
C1-6 alkylthio groups such as a methylthio group, an ethylthio group, a n-propylthio group, an i-propylthio group, a n-butylthio group, an i-butylthio group, a s-butylthio group, and a t-butylthio group;
C1-6 haloalkylthio groups such as a trifluoromethylthio group, and a 2,2,2-trifluoroethylthio group;
C2-6 alkenylthio groups such as a vinylthio group, and an allylthio group;
C2-6 alkynylthio groups such as an ethynylthio group, and a propargylthio group;
C1-6 alkylsulfinyl groups such as a methylsulfinyl group, an ethylsulfinyl group, and a t-butylsulfinyl group;
C1-6 haloalkylsulfinyl groups such as a trifluoromethylsulfinyl group, and a 2,2,2-trifluoroethylsulfinyl group;
C2-6 alkenylsulfinyl groups such as an allylsulfinyl group;
C2-6 alkynylsulfinyl groups such as a propargylsulfinyl group;
C1-6 alkylsulfonyl groups such as a methylsulfonyl group, an ethylsulfonyl group, and a t-butylsulfonyl group;
C1-6 haloalkylsulfonyl groups such as a trifluoromethylsulfonyl group, and a 2,2,2-trifluoroethylsulfonyl group;
C2-6 alkenylsulfonyl groups such as an allylsulfonyl group;
C2-6 alkynylsulfonyl groups such as a propargylsulfonyl group;
tri-C1-6 alkylsilyl groups such as a trimethylsilyl group, a triethylsilyl group, and a t-butyldimethylsilyl group; and
tri-C6-10 arylsilyl groups such as a triphenylsilyl group.

In addition, any hydrogen atoms in these "substituents" may also be substituted with other "substituents" having different structures.

The term "C1-6", for example, indicates that the number of carbon atoms of the group serving as the mother nucleus is 1 to 6. The number of carbon atoms does not include the number of carbon atoms present in substituents. For example, an ethoxybutyl group is classified as a C2 alkoxy C4 alkyl group because a butyl group serves as a mother nucleus and a substituent thereof is an ethoxy group.

Examples of the "alkyl group" as $R^1$, $R^2$, $R^3$, $R^4$, $R^5$ and $R^6$, include a methyl group, an ethyl group, a n-propyl group, an i-propyl group, a n-butyl group, a s-butyl group, an i-butyl group, a t-butyl group, a n-pentyl group, and a n-hexyl group, and C1-6 alkyl groups are preferable.

The number of carbon atoms constituting the "aryl group" as $R^5$, $R^6$, $R^7$, $R^8$, $R^9$, $R^{10}$, $L^1$ and $L^2$ is preferably 6 to 40, more preferably 6 to 20, even more preferably 6 to 14, and even more preferably 6.

Examples of the unsubstituted aryl group include a phenyl group, a 1-naphthyl group, a 2-naphthyl group, an azulenyl group, an indanyl group, and a tetranyl group.

Examples of the substituted aryl group include a 4-fluorophenyl group, a 4-chlorophenyl group, a 2,4-dichlorophenyl group, a 3,4-dichlorophenyl group, a 3,5-dichlorophenyl group, a 2,6-difluorophenyl group, a 4-trifluoromethylphenyl group, a 4-methoxyphenyl group, a 3,4-dimethoxyphenyl group, a 3,4-methylenedioxyphenyl group, a 4-trifluoromethoxyphenyl group, and a 4-methoxy-1-naphthyl group.

Among these, the "aryl group" is preferably a phenyl group.

The "heteroaryl group" as $R^1$, $R^2$, $R^3$, $R^4$, $R^5$, $R^6$, $R^7$, $R^8$, $R^9$, and $R^{10}$ may be monocyclic or polycyclic. The remaining rings of a polycyclic heteroaryl group may be any of saturated rings, unsaturated rings and aromatic rings, provided that at least one ring thereof is a heteroaromatic ring. The number of atoms constituting the heteroaryl group is preferably 5 to 40, more preferably 5 to 26, and even more preferably 5 to 14.

Although examples of the heteroaryl group include: 5-membered heteroaryl groups such as a pyrrolyl group, a furyl group, a thienyl group, an imidazolyl group, a pyrazolyl group, an oxazolyl group, an isoxazolyl group, a thiazolyl group, an isothiazolyl group, a triazoly group, an oxadiazoly group, a thiadiazoly group, and a tetrazolyl group; 6-membered heteroaryl groups such as a pyridyl group, a pyrazinyl group, a pyrimidinyl group, a pyridazinyl group, and a triazinyl group; and condensed heteroaryl groups such as an indolyl group, a benzofuryl group, a benzothienyl group, a benzoimidazolyl group, a benzoxazolyl group, a benzothiazolyl group, a quinolyl group, an isoquinolyl group, and a quinoxalinyl group, a group of the following formula (ia) or (ib) is preferable.

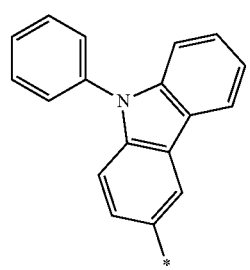

(ia)

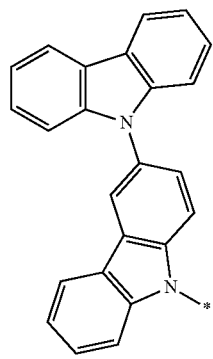

(ib)

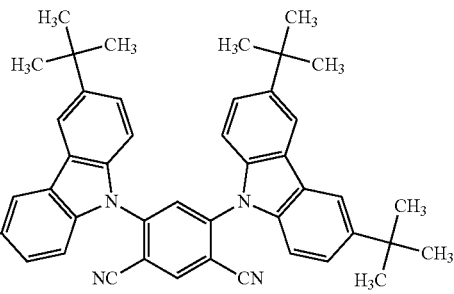

(I-2)

In the formulae (ia) and (ib), * indicates a bonding position with a carbon atom or a nitrogen atom constituting a carbazolyl group in the formula (I) to (III).

Among these, $R^1$, $R^2$, $R^3$ and $R^4$ in the formula (I) are preferably each independently a C1-6 alkyl group.

In the formula (II), $R^5$ and $R^6$ are preferably each independently a hydrogen atom, a C1-6 alkyl group, a phenyl group, a group of the formula (ia), or a group of the formula (ib), but at least one of $R^5$ and $R^6$ is not a hydrogen atom. In the case where at least one of $R^5$ and $R^6$ is a C1-6 alkyl group or a phenyl group, it is preferable that the other not be a hydrogen atom.

$L^1$ and $L^2$ are preferably phenyl groups.

In the formula (III), $R^7$, $R^8$, $R^9$ and $R^{10}$ are preferably each independently a hydrogen atom, a C1-6 alkyl group, a phenyl group, a group of the formula (ia), or a group of the formula (ib). At least one of $R^7$, $R^8$, $R^9$ and $R^{10}$ is not a hydrogen atom. In the case where at least one of $R^7$, $R^8$, $R^9$ and $R^{10}$ is a C1-6 alkyl group or a phenyl group, it is preferable that the remaining groups not be hydrogen atoms.

$L^1$ and $L^2$ are preferably phenyl groups.

Specific examples of the isophthalonitrile compound according to the present invention include the following compounds (I-1) to (III-8), and the compounds (I-1), (I-2), (II-1), (II-2), (II-3) and (II-6) are preferable.

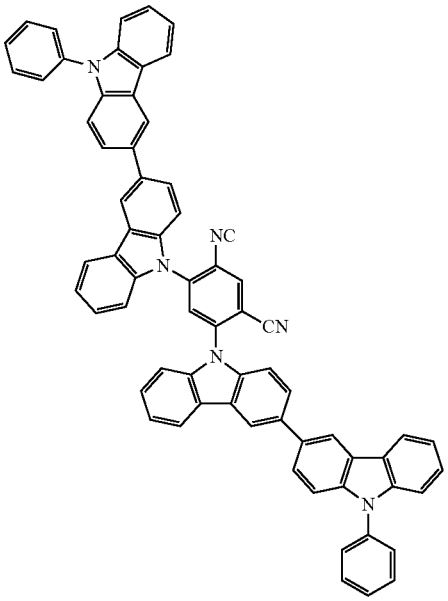

(I-3)

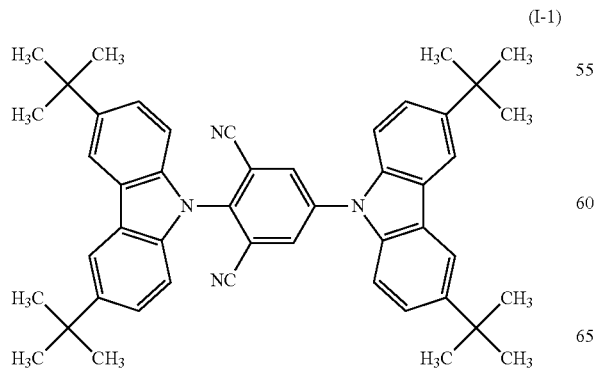

(I-1)

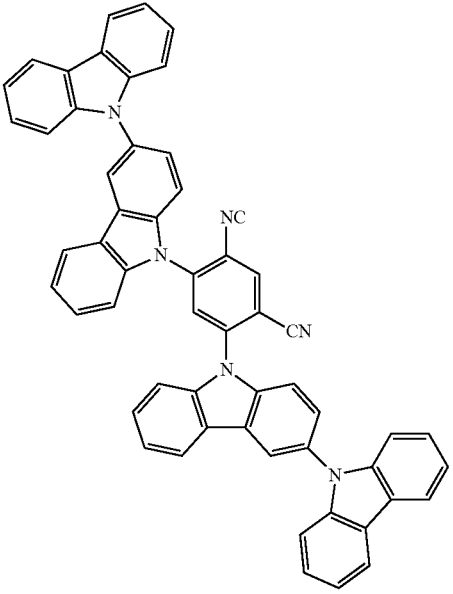

(I-4)

(I-5)
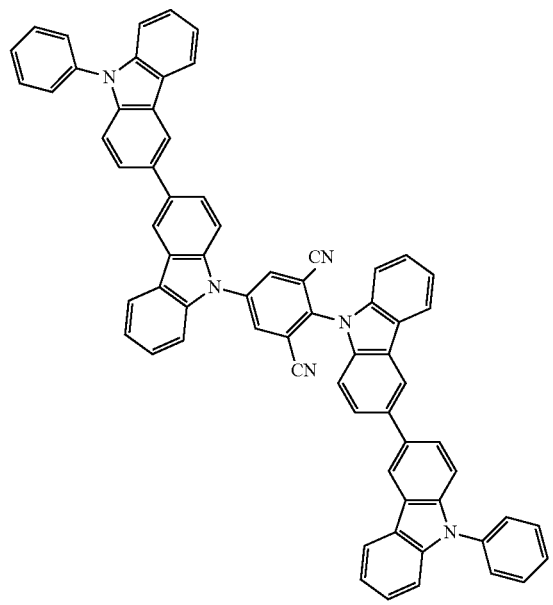
(I-6)
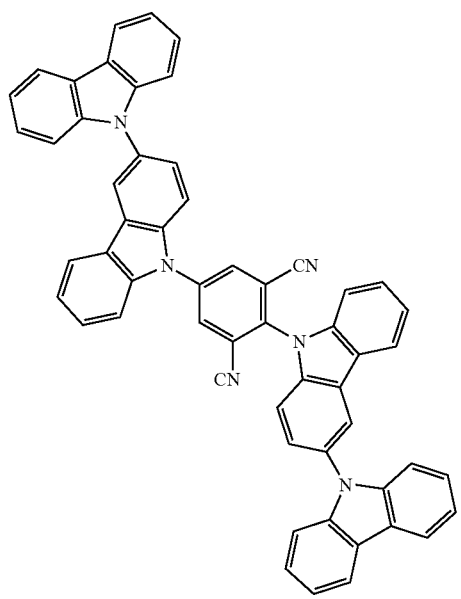
(II-1)
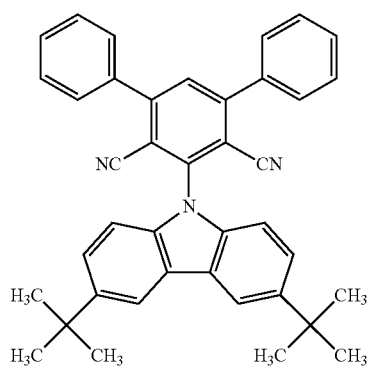
(II-2)
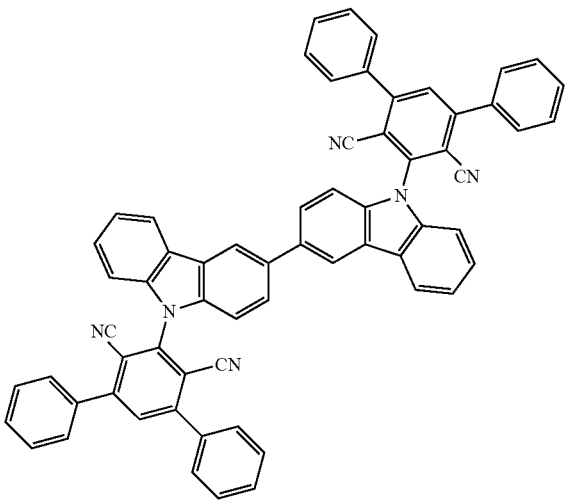
(II-3)
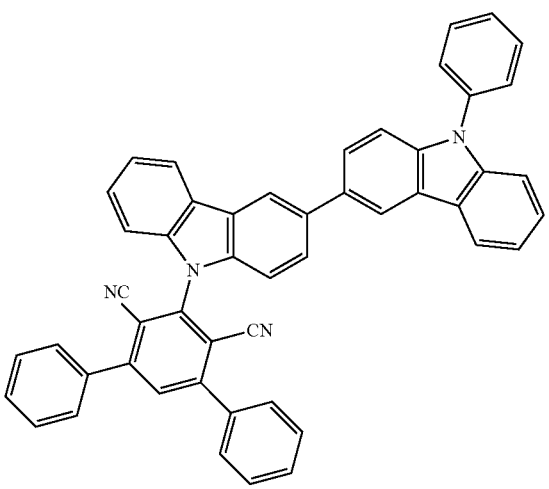
(II-4)
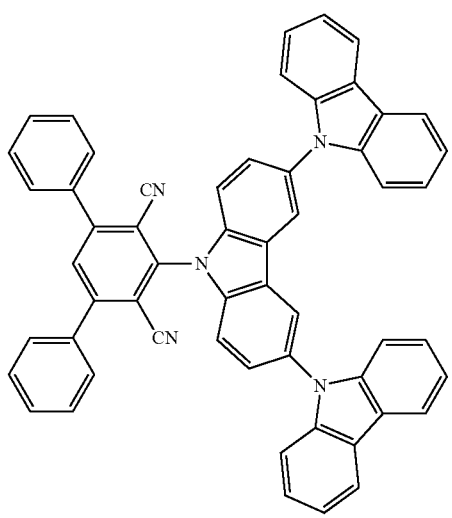

(II-5)
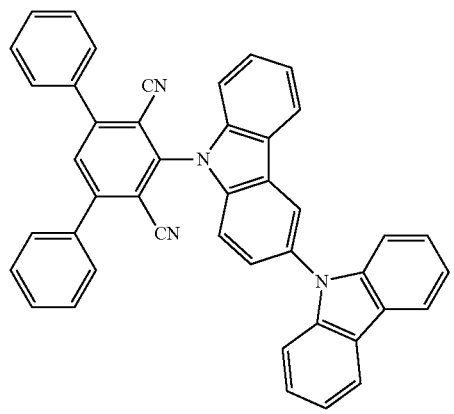
(II-6)
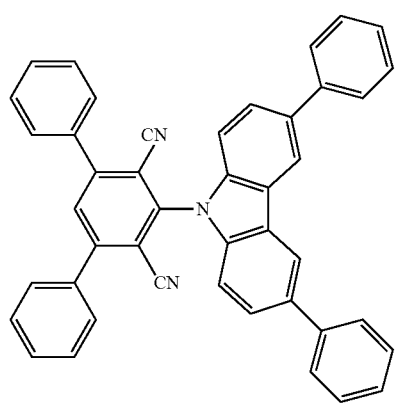
(III-1)
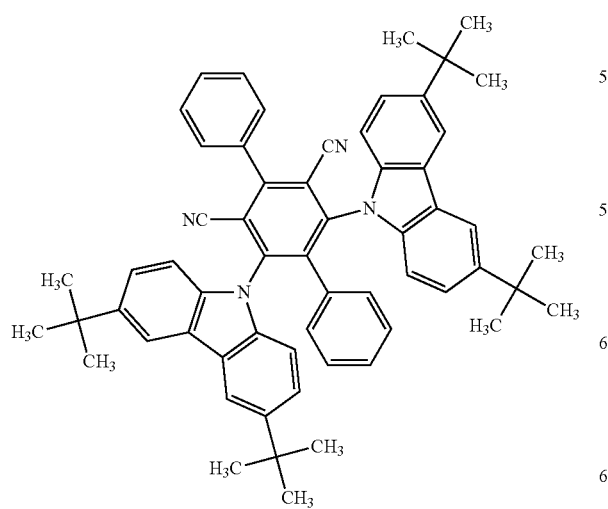
(III-2)
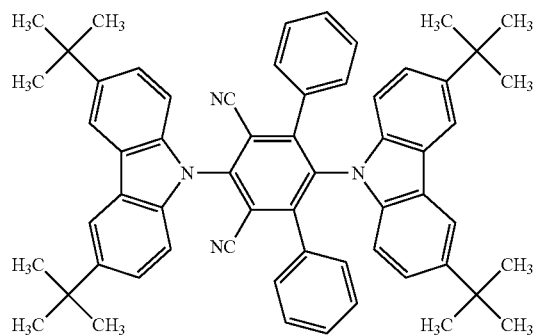
(III-3)
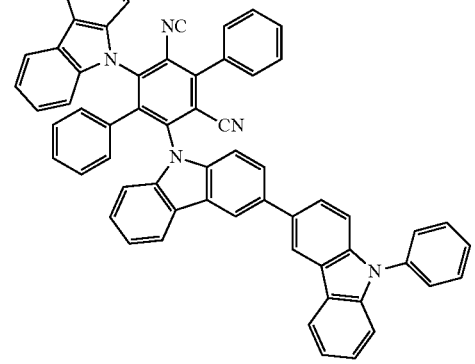
(III-4)
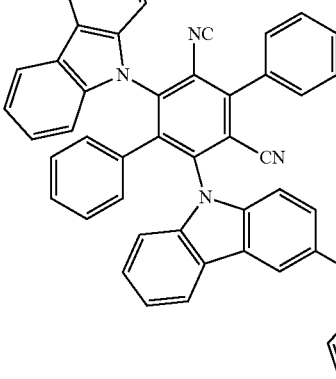

(III-5)

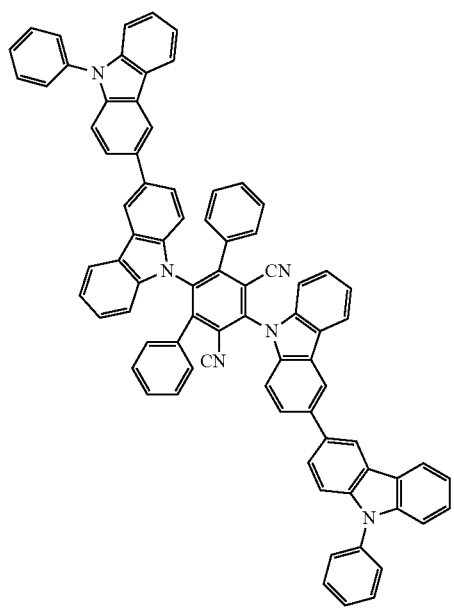

(III-6)

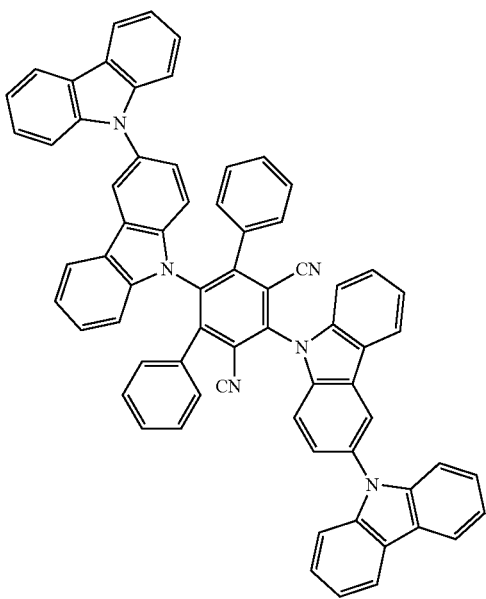

(III-7)

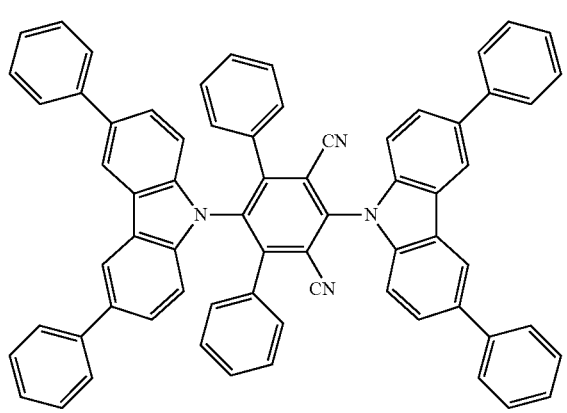

(III-8)

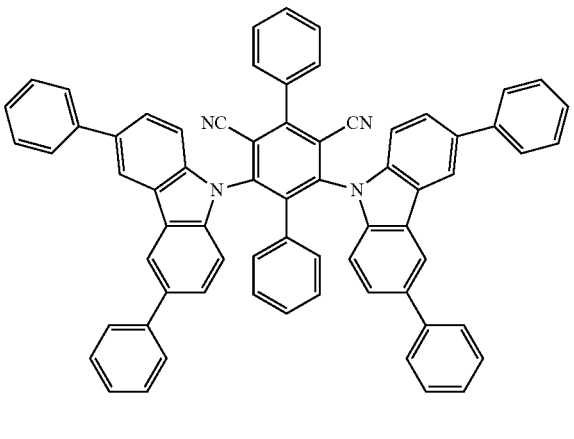

The isophthalonitrile compound according to the present invention may be obtained by performing known synthesis reactions (such as a coupling reaction or substitution reaction) in combination. Purification of synthesized compounds may be carried out by purification using column chromatography, adsorption purification using silica gel, activated carbon, activated clay, or the like, or recrystallization or crystallization using a solvent. Compound identification may be performed by NMR analysis or the like.

The compound according to the present invention may be obtained as follows, for example.

(Embodiment 1) Synthesis of 2,5-bis(3,6-di-tert-butyl-9H-carbazol-9-yl)isophthalonitrile (Compound (I-1): BCz-2IN-I)

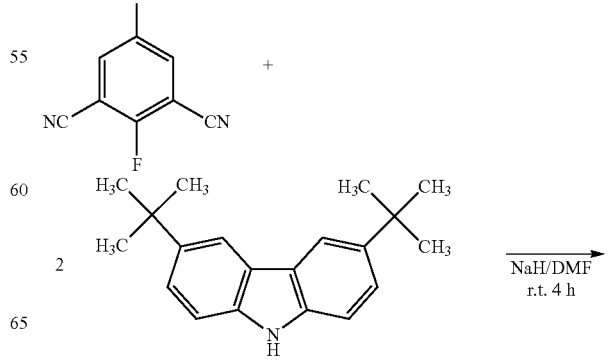

-continued

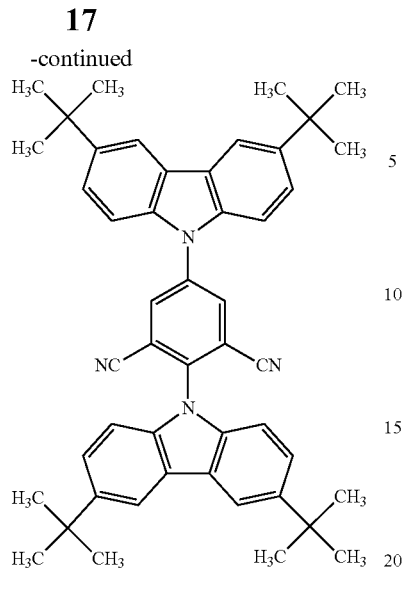

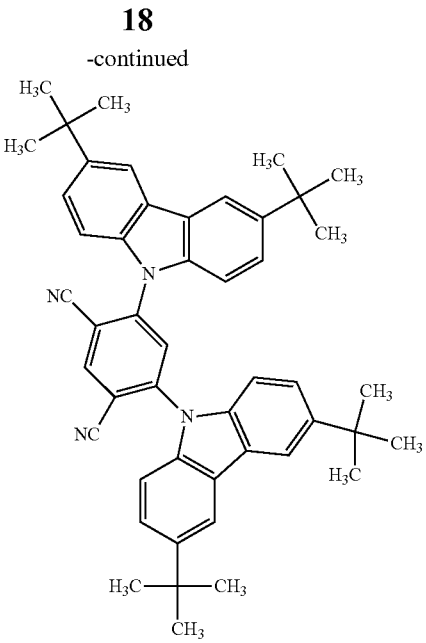

2,5-Difluoroisophthalonitrile, 3,6-di-t-butylcarbazole, and dehydrated DMF are put into a reaction container and then cooled. Sodium hydride is added gradually to allow the reaction to proceed at room temperature, and the thus obtained reaction liquid is poured into ice water, followed by filtering the resultant mixture to collect precipitated crystal, and then washing the collected crystal to obtain the target compound.

(Embodiment 2) Synthesis of 2,4-bis(3,6-di-tert-butyl-9H-carbazol-9-yl)isophthalonitrile (Compound (I-2): BCz-2IN-II)

3,6-Di-t-butylcarbazole is put in a reaction container in which the atmosphere is replaced with nitrogen, and then is dissolved in dehydrated tetrahydrofuran. Sodium hydride (0.56 g, 14.0 mmol) is added thereto while conducting cooling with ice water, followed by stirring the mixture at room temperature to allow the reaction to proceed. The resultant mixture is cooled with ice water, and 4,5-difluoroisophthalonitrile dissolved in dehydrated tetrahydrofuran is added thereto under a nitrogen gas stream, followed by reacting the mixture at room temperature. The reaction solution is cooled with ice water, and then water and ethyl acetate are added thereto to separate an organic layer, followed by further subjecting an aqueous layer to extraction with ethyl acetate, and then washing the mixed organic layer with saturated saline. The organic layer is dehydrated with magnesium sulfate, filtered, concentrated, and purified to obtain the target compound.

(Embodiment 3) Synthesis of 2-(3,6-di-tert-butyl-9H-carbazol-9-yl)-4,6-diphenyl-isophthalonitrile (Compound (II-1): BCz-2PIN)

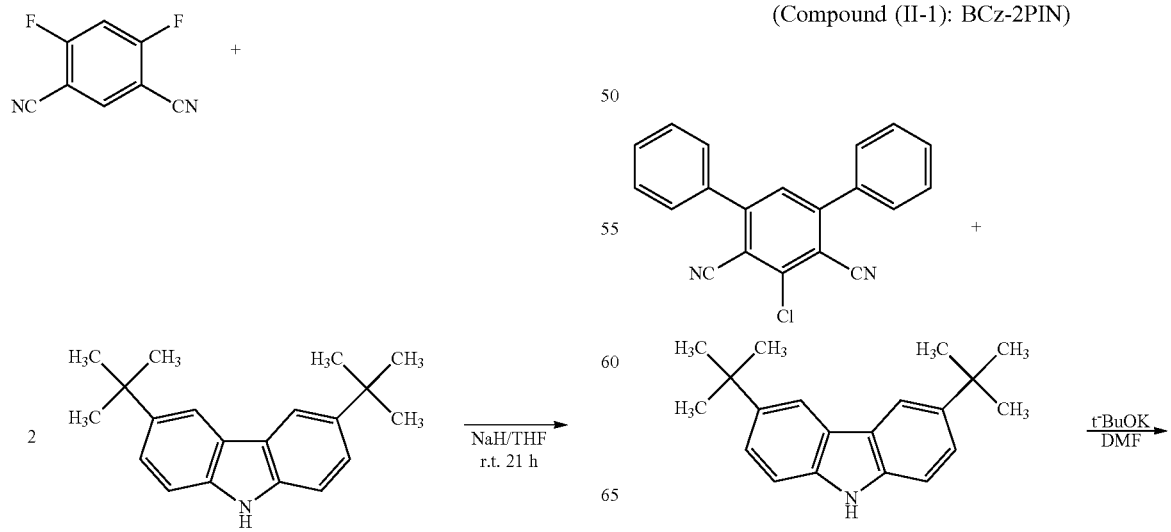

-continued

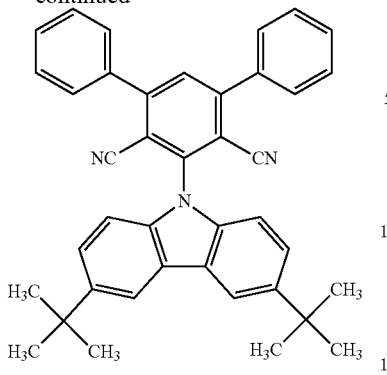

Potassium tert-butoxide, dehydrated DMF, and 3,6-di-t-butylcarbazole are put in a reaction container, and then stirred at room temperature to allow the reaction to proceed. Then, 5'-chloro-[1,1':3',1''-terphenyl]-4',6'-dicarbonitrile is added thereto, and then refluxed, followed by pouring the resultant reaction solution into water, and then adding dichloromethane thereto to subject the mixture to extraction. The resultant organic layer is dried, filtered, concentrated, and purified to obtain the target compound.

(Embodiment 4) Synthesis of 2-(3-(9-phenyl-9H-carbazol-3-yl)-9H-carbazol-9-yl)-4,6-diphenyl-isophthalonitrile (Compound III-3): Ph-BiCz-PIN

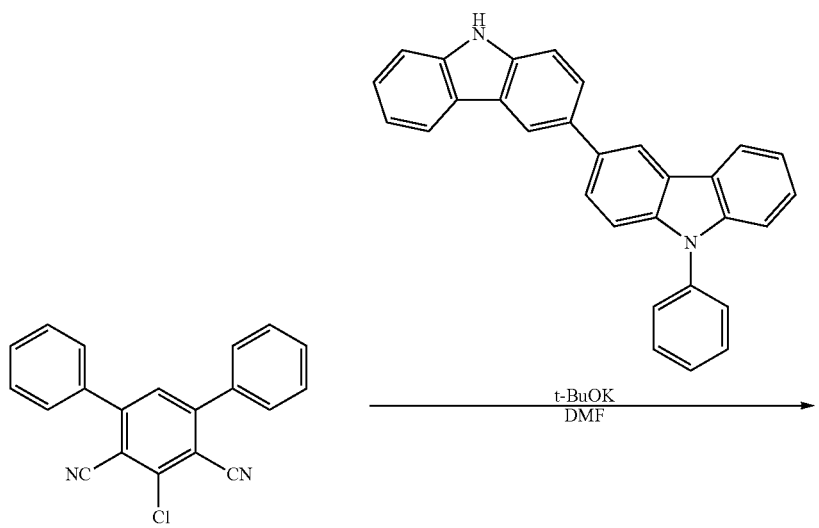

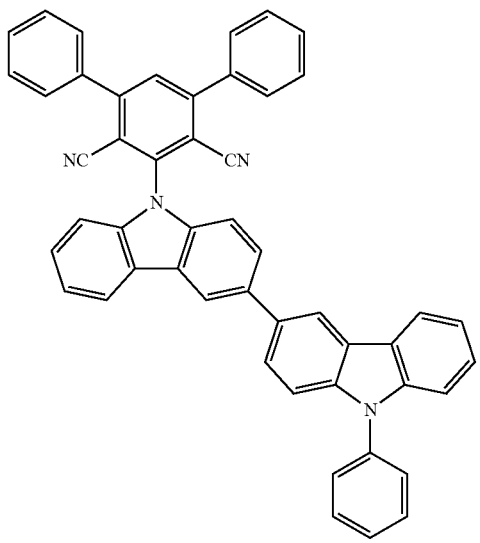

t-BuOK, dehydrated DMF, and 9-phenyl-9H,9'H-3,3'-bicarbazole are put into a reaction container and then the mixture is stirred at room temperature to allow the reaction to proceed. Then, 5'-chloro-[1,1':3',1''-terphenyl]-4',6'-dicarbonitrile is added thereto and then refluxed, followed by pouring the resultant reaction solution into water, and then adding dichloromethane thereto to subject the mixture to extraction. The resultant organic layer is dried, filtered, concentrated, and purified to obtain the target compound.

(Embodiment 5) Synthesis of 2-(3-(9-(4,6-diphenyl-isophthalonitril-2-yl)-9H-carbazol-3-yl)-9H-carbazol-9-yl)-4,6-diphenyl-isophthalonitrile (Compound (II-2): BiCz-2PIN)

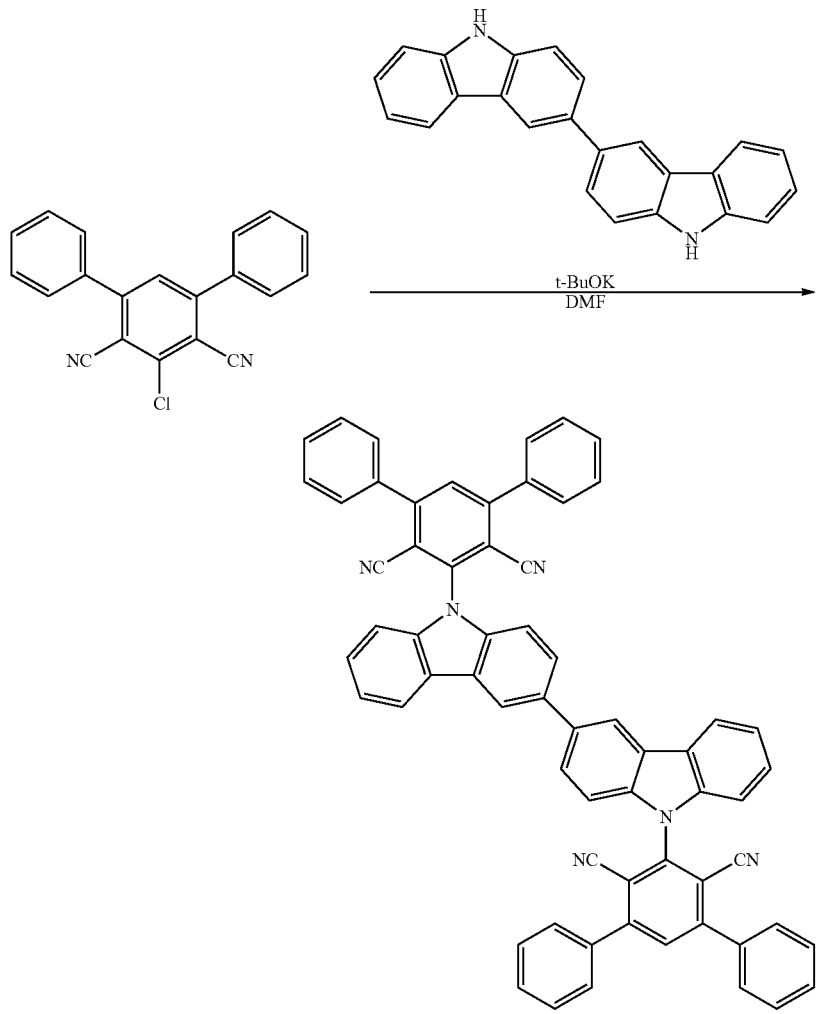

t-BuOK, dehydrated DMF, and 9H,9'H-3,3'-bicarbazole are put into a reaction container, and then stirred at room temperature to allow the reaction to proceed. Then, 5'-chloro-[1,1':3',1''-terphenyl]-4',6'-dicarbonitrile is added thereto and then refluxed. The resultant reaction solution is poured into water, and dichloromethane is added thereto to subject the mixture to extraction. The resultant organic layer is dried, filtered, concentrated, and purified to obtain the target compound.

(Embodiment 6) Synthesis of 2-(3,6-di-phenyl-9H-carbazol-9-yl)-4,6-diphenyl-isophthalonitrile (Compound (II-6): PCz-PIN)

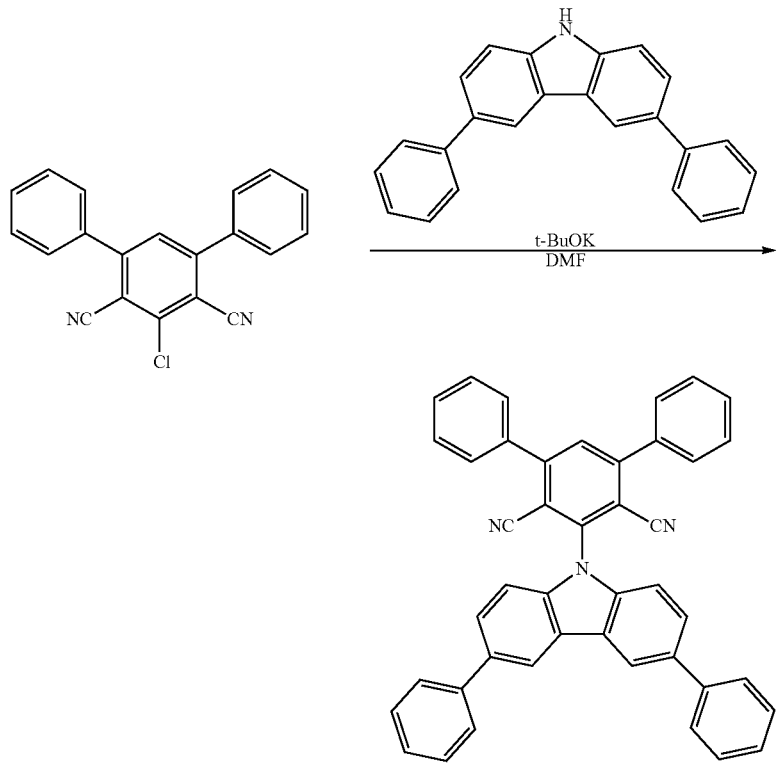

t-BuOK, dehydrated DMF, and 3,6-diphenylcarbazole are put into a reaction container, and then stirred at room temperature to allow the reaction to proceed. Then, 5'-chloro-[1,1':3',1''-terphenyl]-4',6'-dicarbonitrile is added thereto, and then refluxed, followed by pouring the resultant reaction solution into water, and then adding dichloromethane thereto to subject the mixture to extraction. The resultant organic layer is dried, filtered, concentrated, and purified to obtain the target compound.

The isophthalonitrile compounds according to the present invention may be used as a luminescent material. The luminescent material according to the present invention can provide a luminescent element such as an organic photoluminescence element or an organic electroluminescence element. The isophthalonitrile compound according to the present invention has a function of assisting the emission of another luminescent material (host material), and therefore the compound may be doped with other luminescent materials.

The organic photoluminescent element according to the present invention is formed by providing a luminescent layer containing a luminescent material according to the present invention on a substrate. The luminescent layer may be formed by conducting a coating method such as spin coating, a printing method such as an ink-jet printing method, a vapor deposition method, or the like.

The organic electroluminescent element according to the present invention is formed by providing organic layers between an anode and a cathode. The term "organic layers" in the present invention refers to layers located between an anode and a cathode, the layers being substantially composed of organic substances, and the layers may include inorganic substances provided that the performance of the luminescent element according to the present invention is not impaired.

The structure of one embodiment of an organic electroluminescent element according to the present invention is composed of a substrate, an anode, a hole injection layer, a hole transport layer, an electron-blocking layer, a luminescent layer, a hole-blocking layer, an electron-transporting layer, and a cathode, which are provided in this order, and an electron injection layer may be further provided between the electron-transporting layer and the cathode. In the multilayered structure, it is possible to omit some of the organic layers, and, for example, an anode, a hole transport layer, a luminescent layer, an electron-transporting layer, an electron injection layer, and a cathode may be provided on a substrate in this order, alternatively, or an anode, a hole transport layer, a luminescent layer, an electron-transporting layer, and a cathode may be provided on a substrate in this order. The luminescent material according to the present invention may be doped not only in a light-luminescent layer, but also in a hole injection layer, a hole transport layer, an electron-blocking layer, a hole-blocking layer, an electron-transporting layer, or an electron injection layer.

The substrate is to be a support of the luminescent element, and a silicon plate, a quartz plate, a glass plate, a metal plate, a metal foil, a resin film, or a resin sheet is used. In particular, a glass plate, or a transparent plate of synthetic resin such as polyester, polymethacrylate, polycarbonate, or polysulfone is preferred. In the case where a synthetic resin substrate is used, it is necessary to pay attention to the gas barrier property. In the case where the gas barrier property of the substrate is too low, the luminescent element may be deteriorated by the outside air passing through the substrate. Therefore, it is preferable to ensure the gas barrier properties on either one or both sides of the synthetic resin substrate provided with a dense silicon oxide film or the like.

An anode is provided on the substrate. A material having a high work function is generally used to form the anode. Examples of the anode material include: metals such as aluminum, gold, silver, nickel, palladium, and platinum; metal oxides such as indium oxide, tin oxide, ITO, zinc oxide, $In_2O_3$—ZnO, and IGZO; metal halides such as copper iodide, carbon black, and conductive polymers such as poly (3-methylthiophene), polypyrrole, and polyaniline. The anode is usually formed using a sputtering method, or a vacuum deposition method. In the case of fine particles of metal such as silver, fine particles of copper iodide, carbon black, conductive metal oxide fine particles or conductive polymer fine powders, the fine particles are dispersed in a suitable binder resin solution, and then applied on a substrate to form an anode. Furthermore, in the case of the conductive polymer, the conductive polymer may be subjected to electrolytic polymerization to form a thin film directly on a substrate, or may be applied on a substrate to form an anode.

The anode may also be formed by laminating at least two substances different from each other. The thickness of the anode varies depending on the required transparency. In the case where transparency is required, the transmittance of visible light is usually at least 60%, and preferably at least 80%. In this case, the thickness is usually from 10 to 1000 nm, and preferably from 10 to 200 nm. In the case where the anode may be opaque, the thickness of the anode may be approximately the same as that of the substrate. It is preferable that the sheet resistance of the anode be at least several hundred Ω/square.

In a hole injection layer which is provided as needed, a porphyrin compound such as copper phthalocyanine, a naphthalene diamine derivative, a star-burst type triphenylamine derivative, a trimer or a tetramer of triphenylamine such as an arylamine compound having a structure in which at least three triphenylamine structures are bonded with single bonds or divalent groups free from hetero atoms in a molecule thereof, an acceptor heterocyclic compound such as hexacyano azatriphenylene or a coating type polymer material may be used. These materials may be subjected to deposition or a known method such as a spin coating method or an inkjet method to form a thin film.

It is preferable that the hole transport material used in the hole transport layer provided as needed exhibit a high hole injection efficiency from an anode and realize transportation of the injected holes efficiently. For this purpose, a small ionization potential, high transparency to visible light, high hole mobility, excellent stability, and suppressed generation of impurities which become traps during manufacture or use are preferable. Besides the aforementioned general requirements, when application to a vehicle display is intended, it is further preferable that the heat resistance of the element be high. Therefore, a material having a value of 70° C. or more as Tg is desirable.

In the hole transport layer which is provided as needed, a triazole derivative, an oxadiazole derivative, an imidazole derivative, a carbazole derivative, an indolocarbazole derivative, a polyarylalkane derivative, a pyrazoline derivative, a pyrazolone derivative, a phenylenediamine derivative, an arylamine derivative, an amino-substituted chalcone derivative, an oxazole derivative, a styryl anthracene derivative, a fluorenone derivatives, a hydrazone derivative, a stilbene derivative, a silazane derivative, an aniline copolymer, an electroconductive high-molecular oligomer or the like may be used. More specifically, a compound having a m-carbazolylphenyl group, a benzidine derivative such as N,N'-diphenyl-N,N'-di(m-tolyl)-benzidine (hereinafter abbreviated as TPD), N,N'-diphenyl-N,N'-di(α-naphthyl)-benzidine (hereinafter abbreviated as NPD), N,N,N',N'-tetrabiphenylbenzidine, or 1,1-bis[(di-4-tolylamino)phenyl]cyclohexane (hereinafter abbreviated as TAPC), various triphenylamine trimers or tetramers, or a carbazole derivative may be used. One kind of these may be used, or at least two kinds thereof may be used in combination. The hole transport layer may be a film of a single layer structure, or may be a film of a laminated structure. Further, in the hole injection or transport layer, a coating type polymer material such as poly(3,4-ethylenedioxythiophene) (hereinafter abbreviated as PEDOT)/poly(styrenesulfonate) (hereinafter, abbreviated as PSS) may be used. These materials may be subjected to deposition or another known method such as a spin coating method or an inkjet method to form a thin film.

In the hole injection layer or the hole transport layer, materials in which tris-bromophenyl amine hexachloro antimony is P-doped to materials commonly used in the layer, or polymer compounds having the structure of the PD as the partial structure thereof may be used. As the hole injection or transport host material, a carbazole derivative such as CBP, TCTA, mCP, or the like may be used.

Compounds (hi1) to (hi7) which may be preferably used as hole injection materials are shown below.

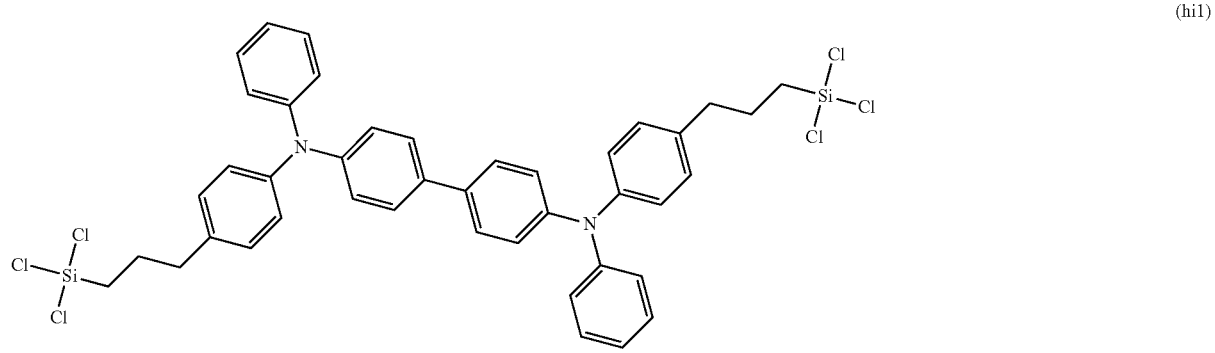

(hi1)

-continued
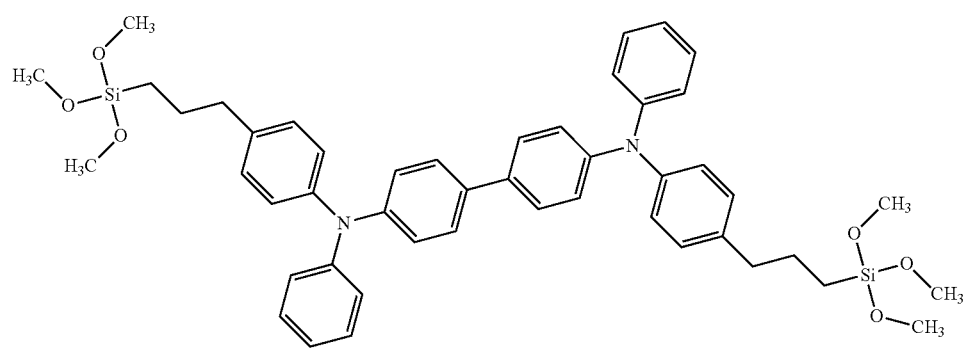
(hi2)
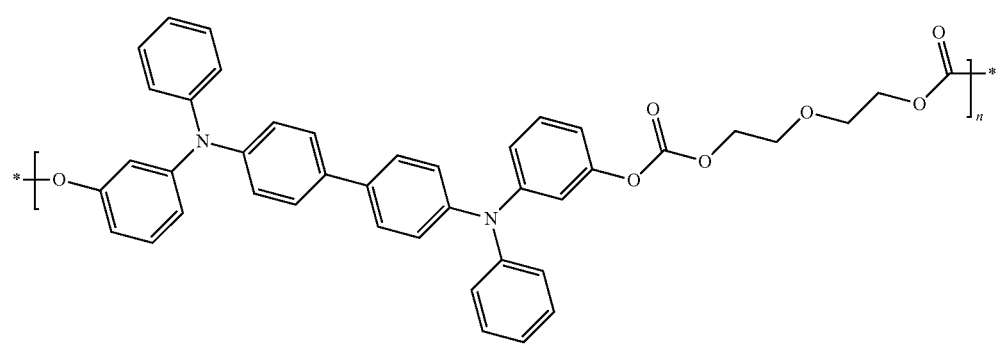
(hi3)
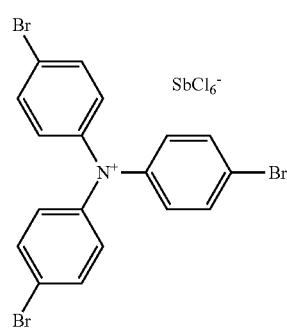
(hi4)
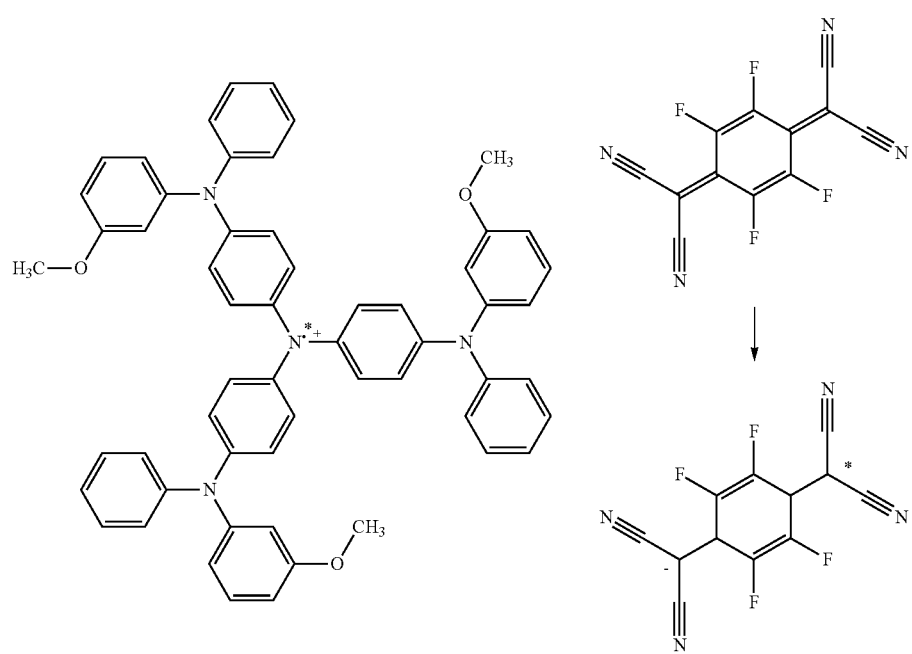
(hi5)

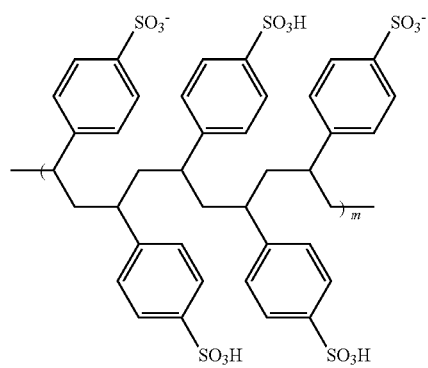
(hi6)
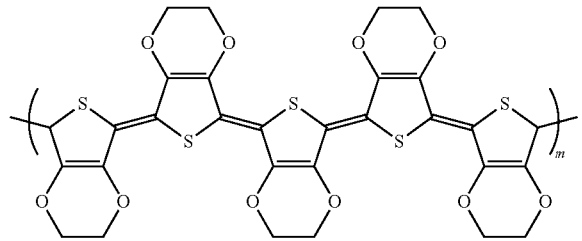
(hi7)
Compounds (ht1) to (ht38) which may be preferably used as hole transport materials are shown below.
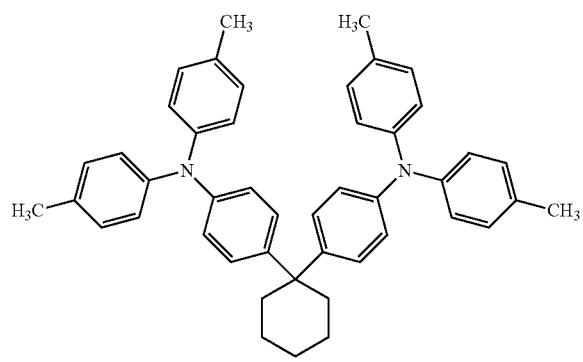
(ht1)
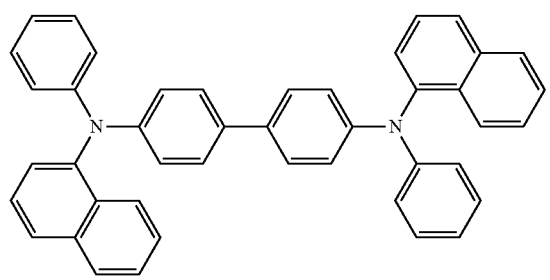
(ht2)
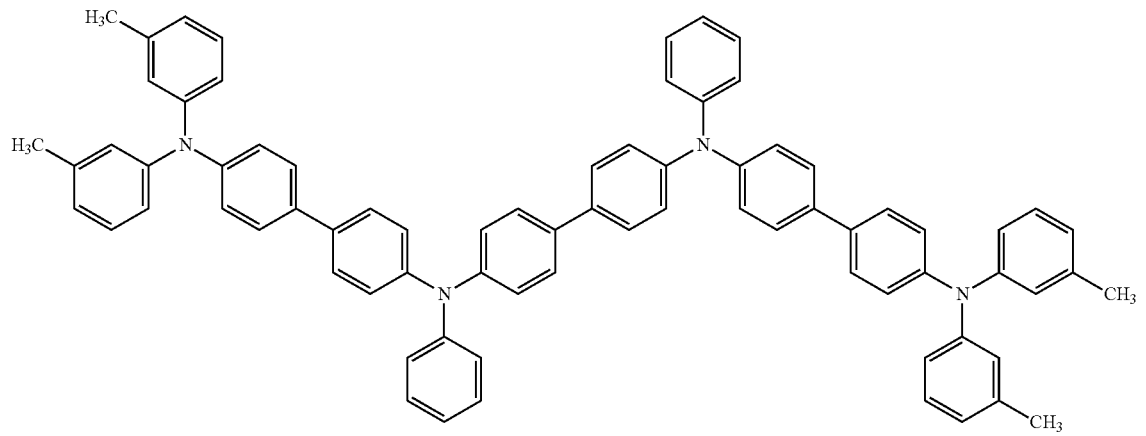
(ht3)

-continued
(ht4)
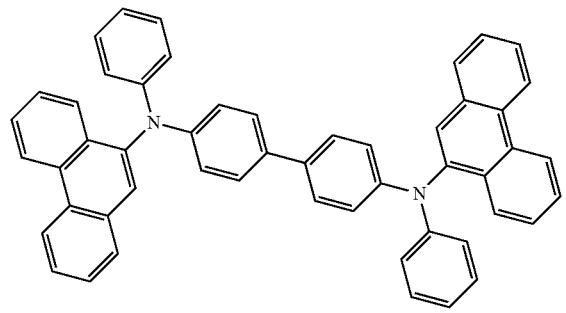
(ht5)
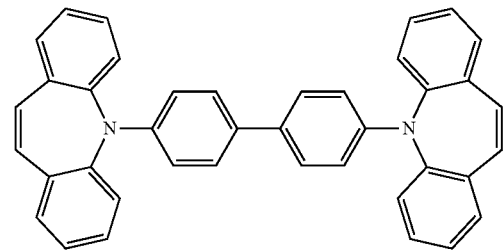
(ht6)
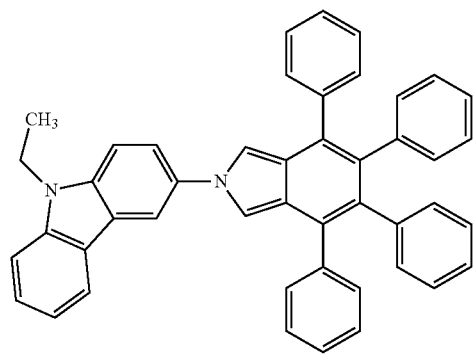
(ht7)
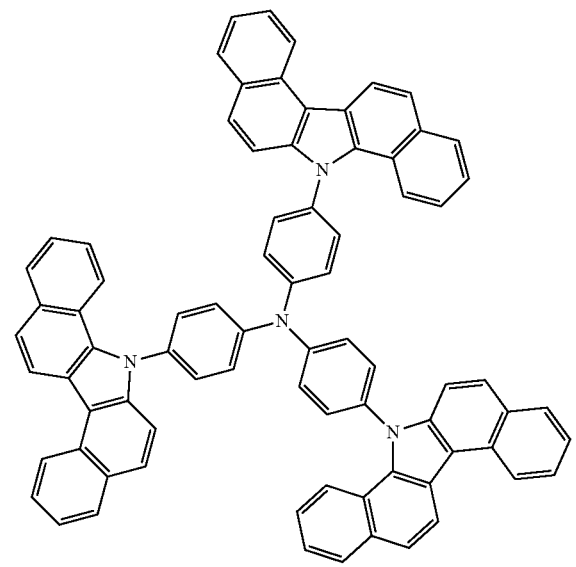
(ht8)
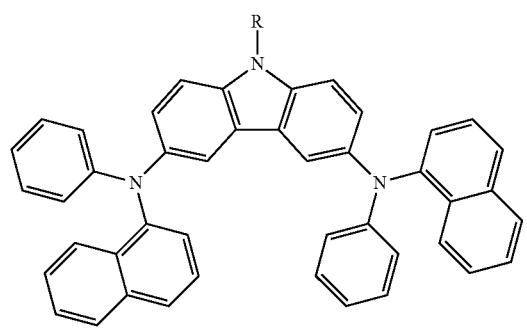
(ht9)
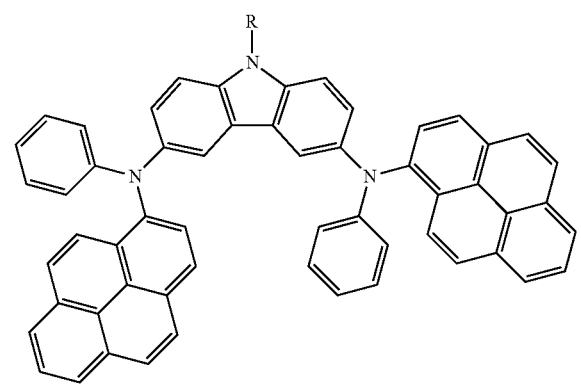

-continued
(ht10)
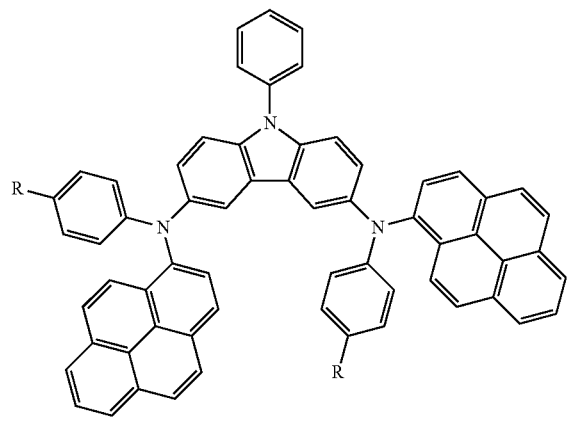
(ht11)
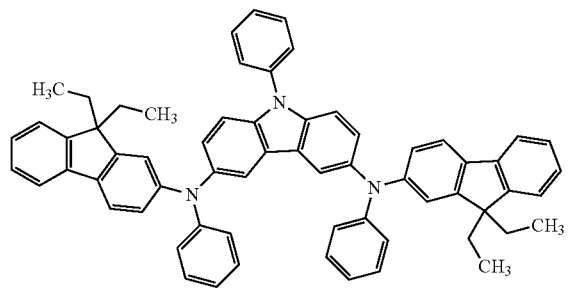
(ht12)
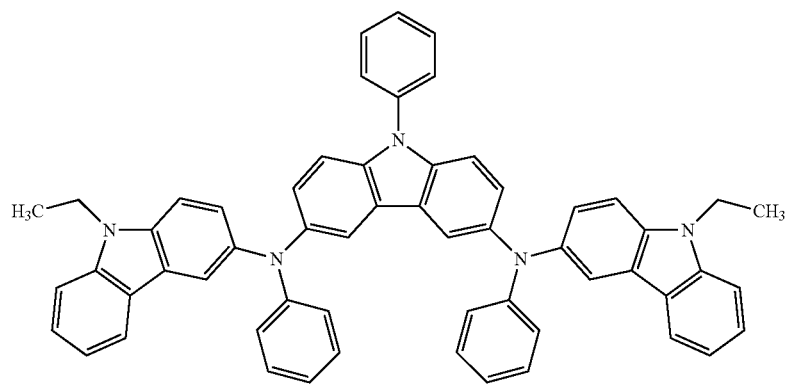
(ht13)
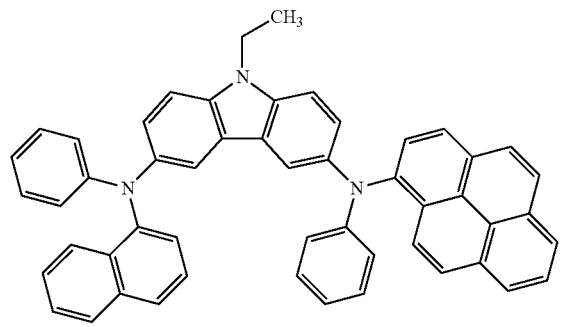
(ht14)
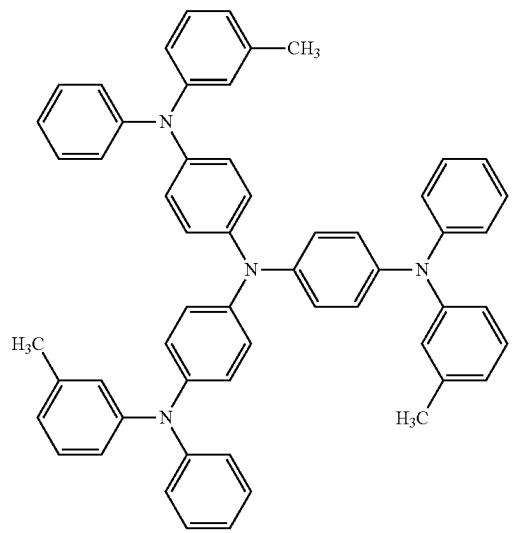

-continued
(ht15)
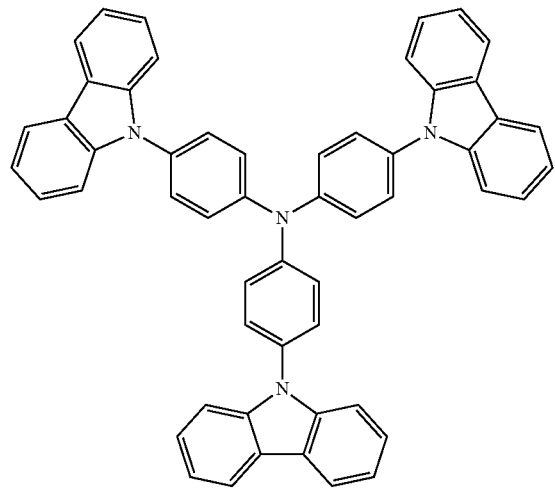
(ht16)
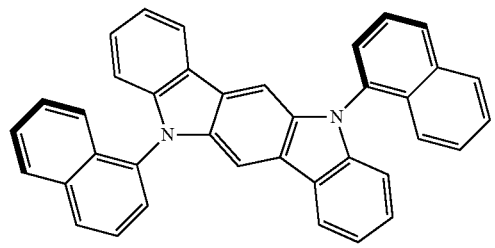
(ht17)
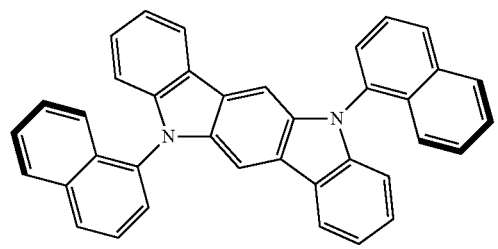
(ht18)
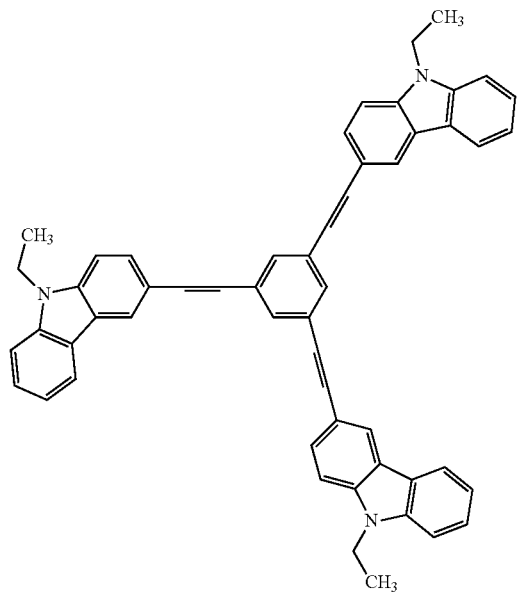
(ht19)
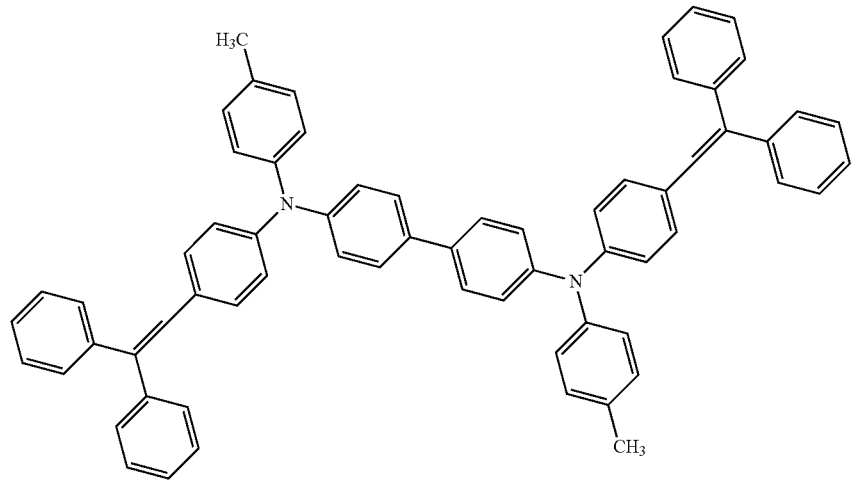

-continued
(ht20)
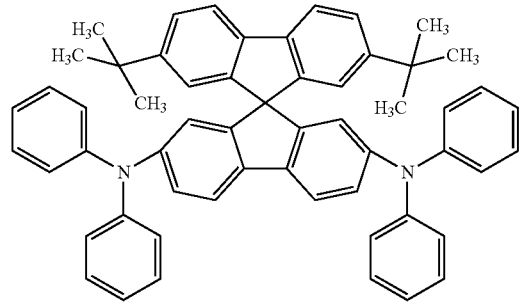
(ht21)
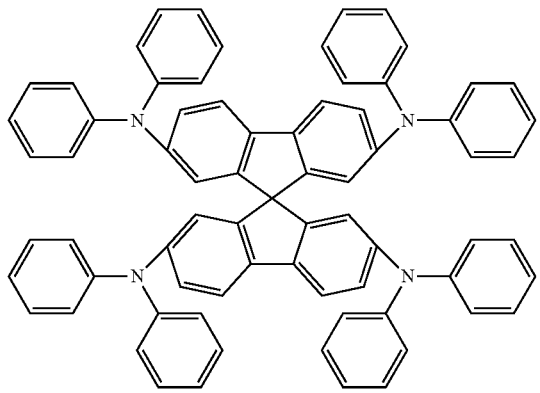
(ht22)
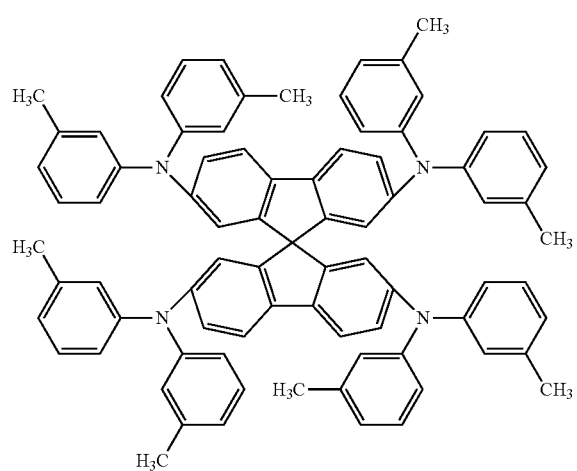
(ht23)
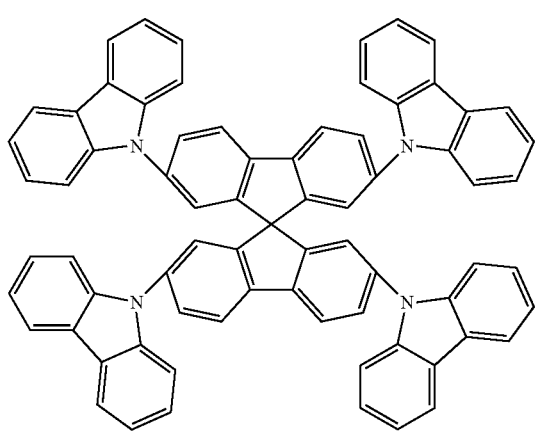
(ht24)
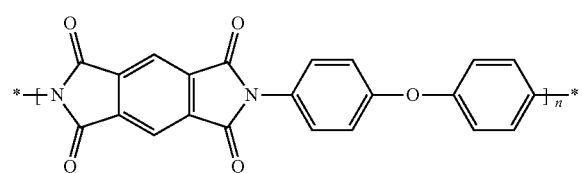
(ht25)
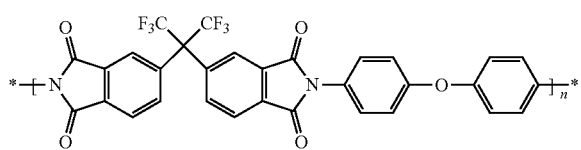
(ht26)
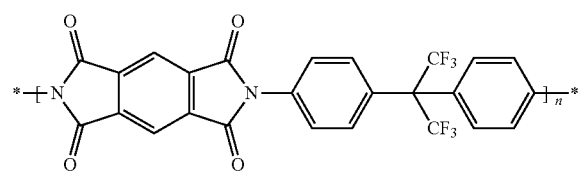
(ht27)
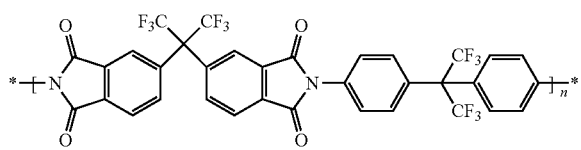

-continued
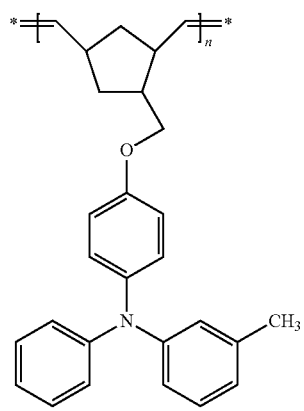
(ht28)
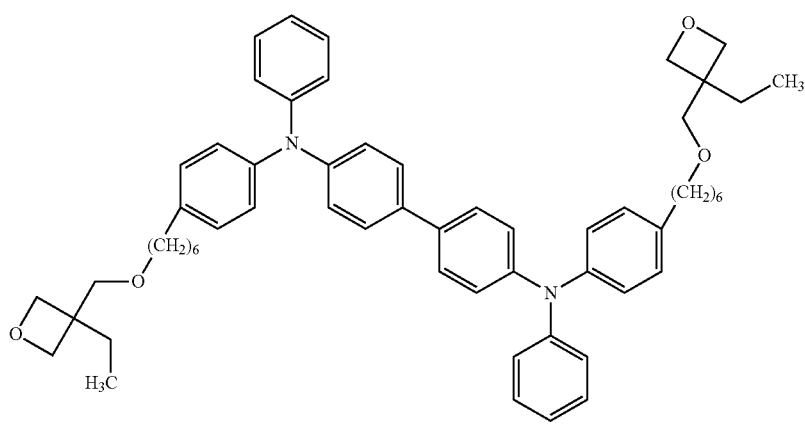
(ht29)
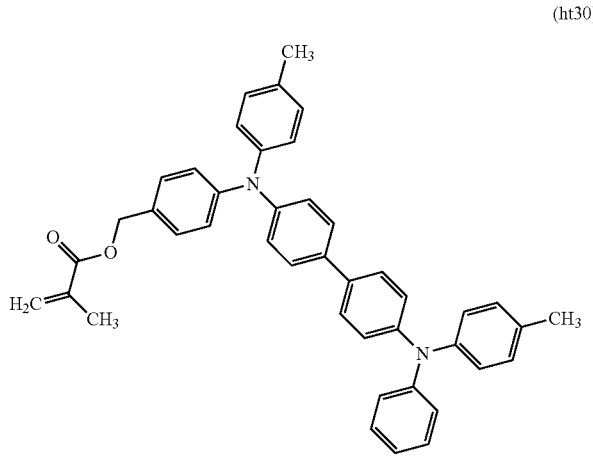
(ht30)
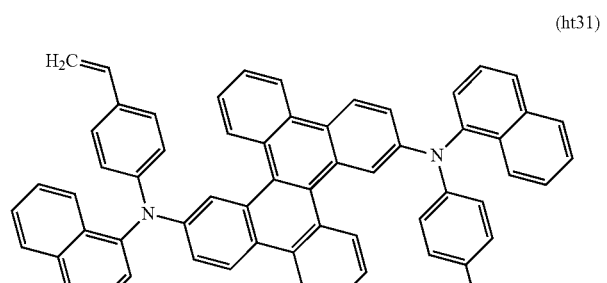
(ht31)

-continued
(ht32)
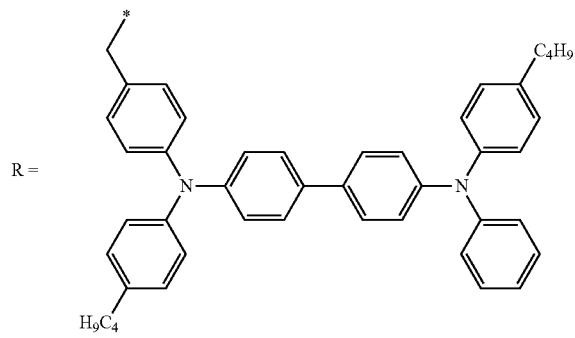
(ht33)
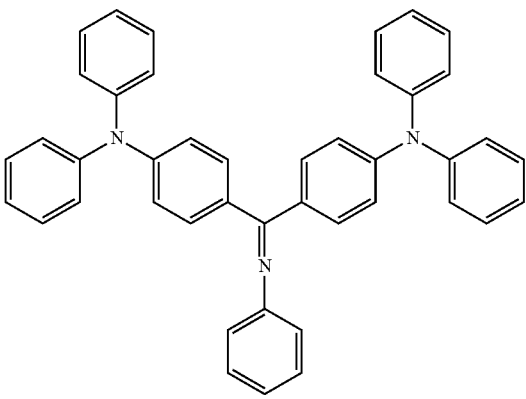
(ht34)
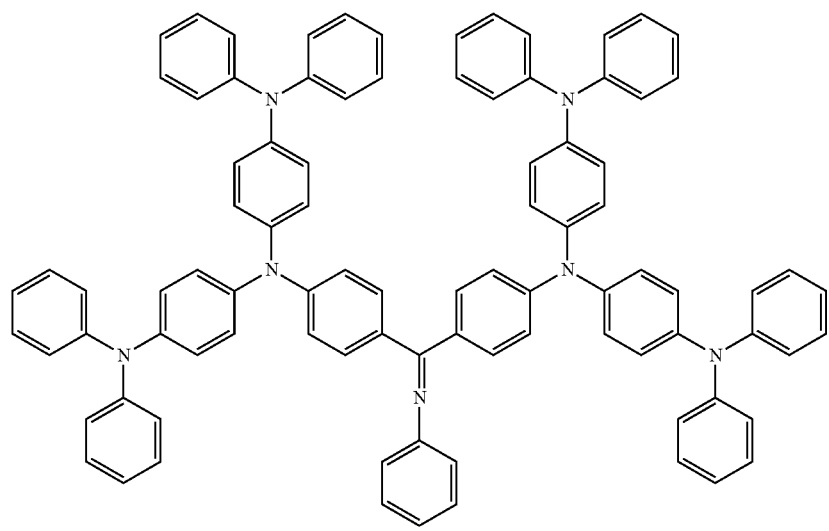
(ht35)
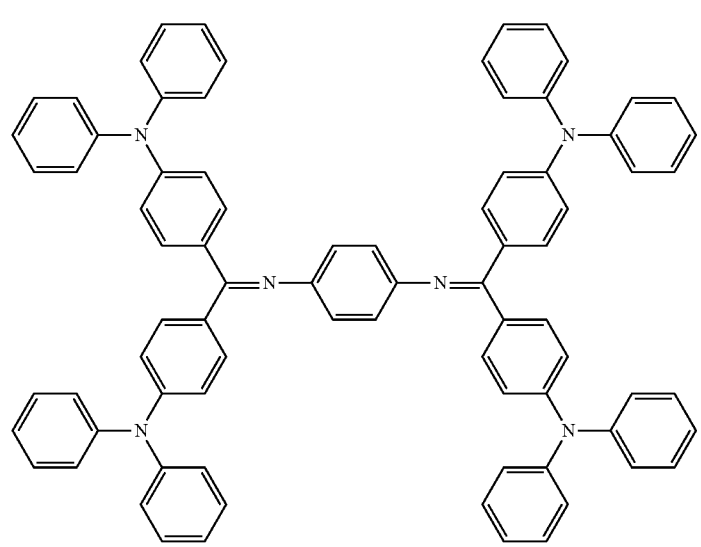

-continued

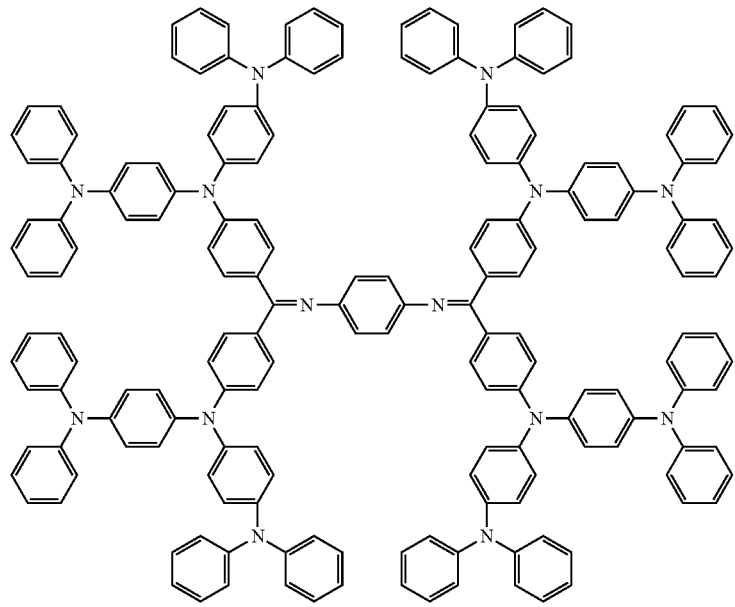
(ht36)

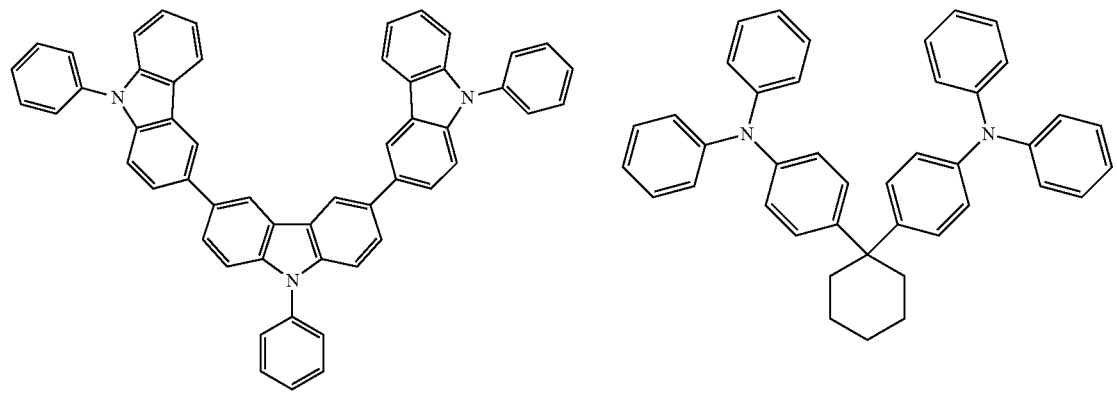
(ht37) (ht38)

In an electron-blocking layer which is provided as needed, a compound having an electron blocking action, such as a carbazole derivative such as 4,4',4''-tri(N-carbazolyl) triphenylamine (hereinafter abbreviated as TCTA), 9,9-bis[4-(carbazol-9-yl) phenyl] fluorene, 1,3-bis(carbazol-9-yl) benzene (hereinafter abbreviated as mCP), or 2,2-bis (4-carbazol-9-yl-phenyl) adamantane (hereinafter, abbreviated as Ad-Cz), or a compound having a triphenylsilyl group and a triarylamine structure, such as 9-[4-(carbazol-9-yl) phenyl]-9-[4-(triphenylsilyl) phenyl]-9H-fluorene may be used. One of the materials may be used alone or at least two thereof may be used in combination. The electron-blocking layer may be a film having a single layer structure, or may be a film having a laminated structure. The materials may be subjected to deposition or another known method such as a spin coating method or an inkjet method to form a thin film.

Compounds (es1) to (es5) which may be preferably used as electron-blocking materials are shown below.

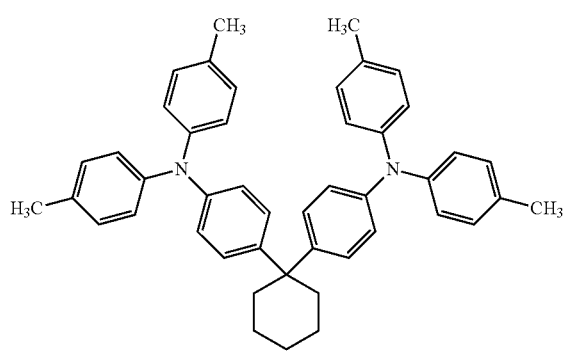
(es1)

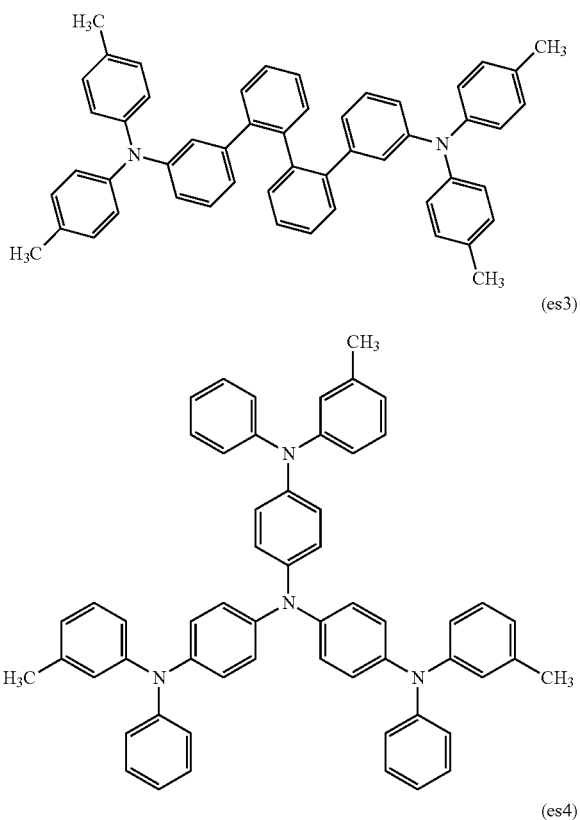

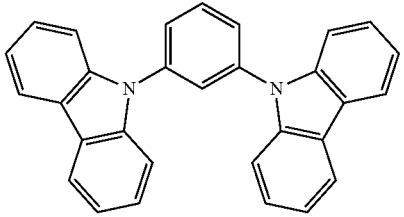

A luminescent layer is a layer configured to exhibit light-emission by generating excitons due to recombination of holes and electrons respectively injected from an anode or a cathode. The luminescent layer may be formed using a luminescent material according to the present invention alone, or may be formed by doping the luminescent material according to the present invention to a host material. Examples of the host material include: metal complexes of quinolinol derivatives such as tris (8-hydroxyquinoline) aluminum (hereinafter abbreviated as Alq3); anthracene derivatives, bisstyrylbenzene derivatives, pyrene derivatives, oxazole derivatives, polyparaphenylene vinylene derivatives, compounds having a bipyridyl group and an ortho-terphenyl structure, mCP, thiazole derivatives, benzimidazole derivatives, and polydialkylfluorene derivatives. The luminescent layer may contain a known dopant. Examples of the dopant include quinacridone, coumarin, rubrene, anthracene, perylene and derivatives thereof, benzopyran derivatives, rhodamine derivatives, and aminostyryl derivatives. A phosphorescent material such as a green phosphorescent material such as Ir(ppy)3, a blue phosphorescent material such as FIrpic, or FIr6, or a red phosphorescent material such as Btp2Ir (acac) may also be used. One of the materials may be used alone, or at least two thereof may be used in combination. The luminescent layer may be a film of a single layer structure, or may be a film of a laminated structure. The materials may be subjected to deposition or another known method such as a spin coating method or an inkjet method to form a thin-film.

In the case where a host material is used, the lower limit of the amount of the luminescent material according to the present invention which may be contained in the luminescent layer is preferably 0.1% by mass and more preferably 1% by mass, and the upper limit thereof is preferably 50% by mass, more preferably 20% by mass, and even more preferably 10% by mass.

Compounds (el1) to (el40) which may be preferably used as host materials in the luminescent layer are shown below.

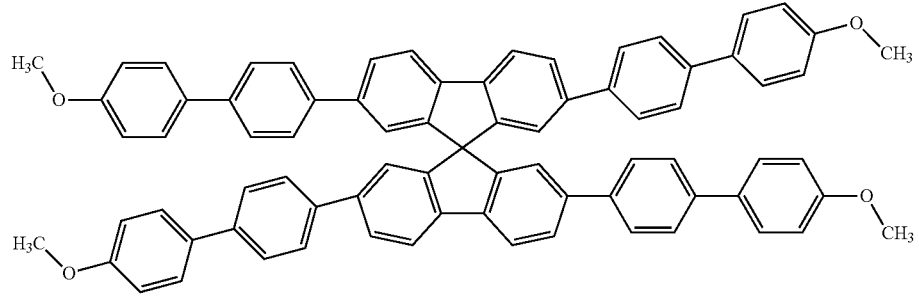

(el2)
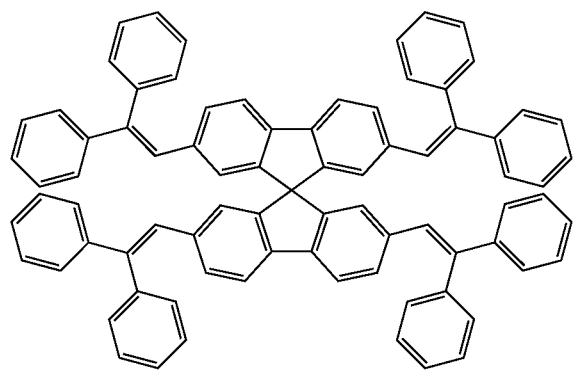
(el3)
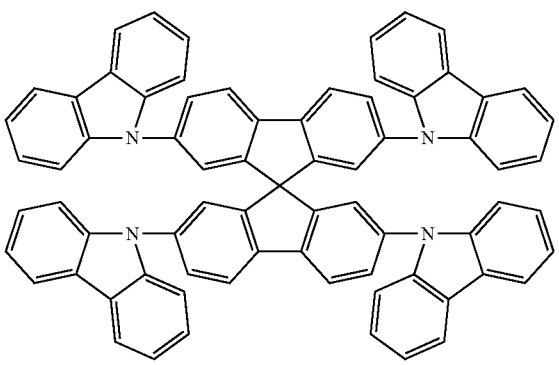
(el4)
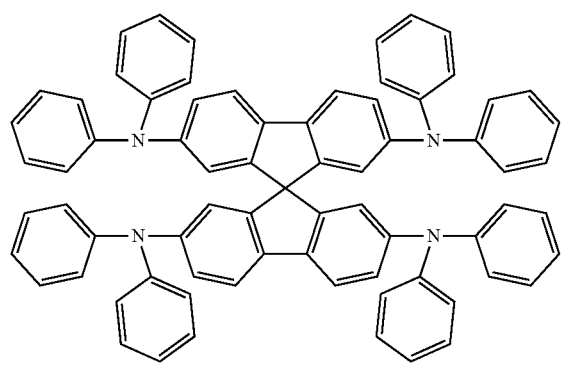
(el5)
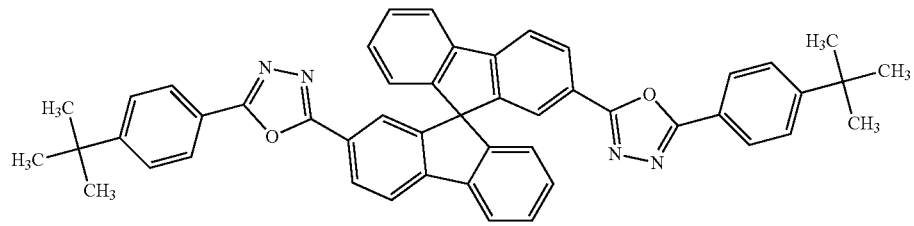
(el6)
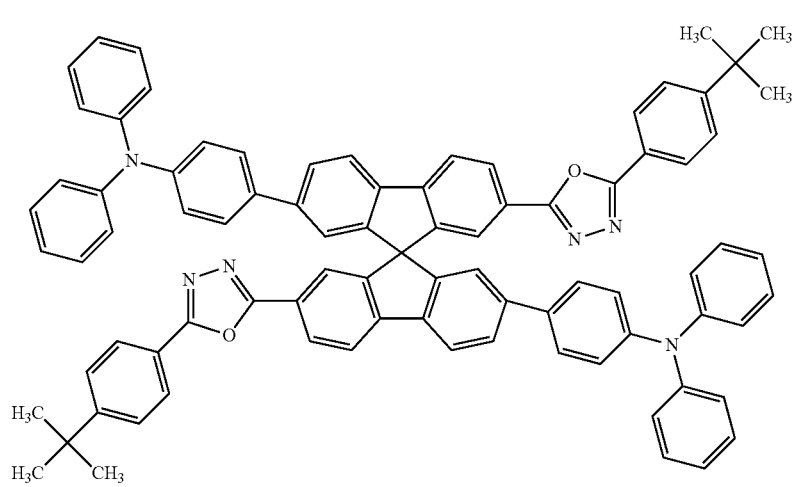

(el7)
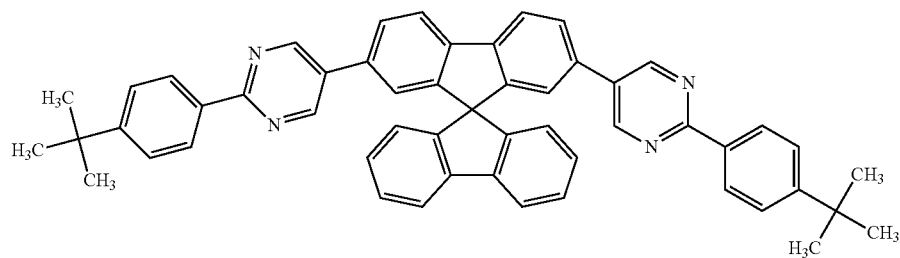
(el8)
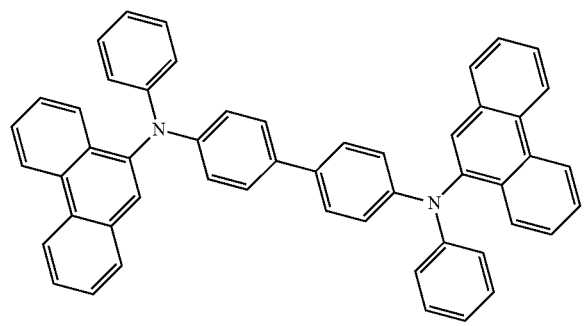
(el9)
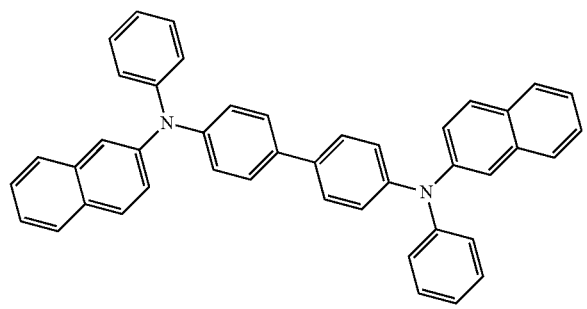
(el10)
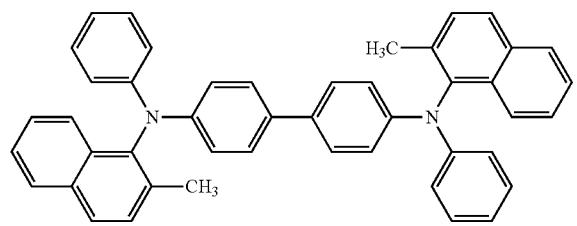
(el11)
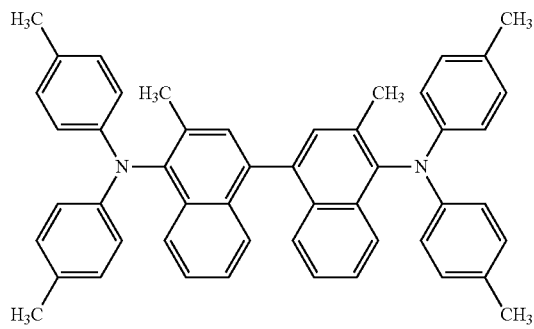
(el12)
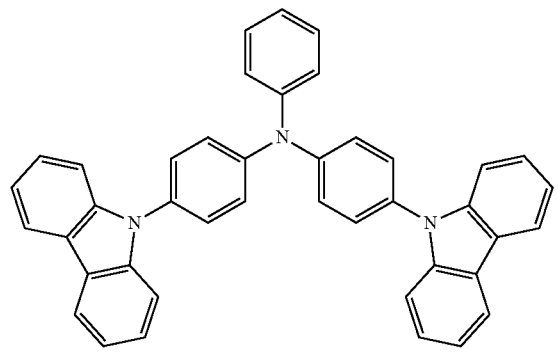
(el13)
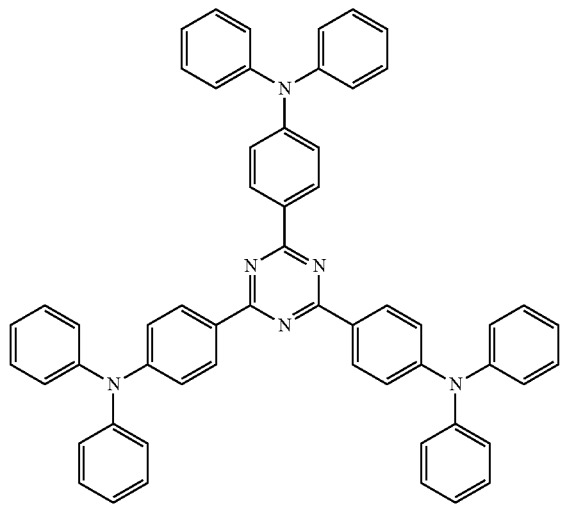

-continued
(el14) 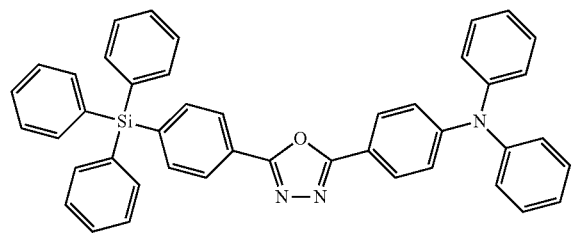
(el15) 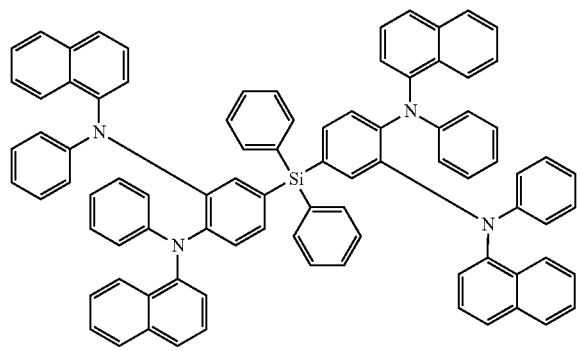
(el16) 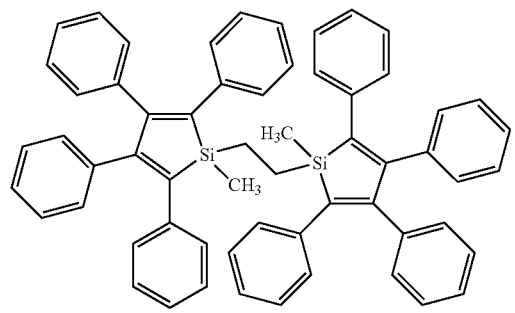
(el17)
(el18) 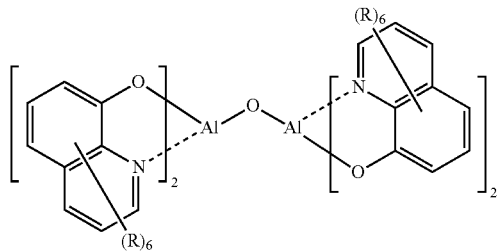
(el19)
(el20) 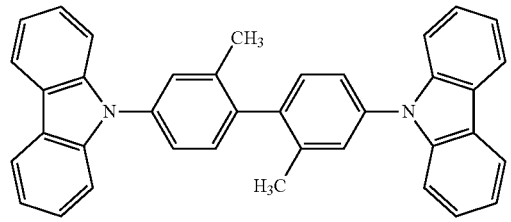
(el21)
(el22) 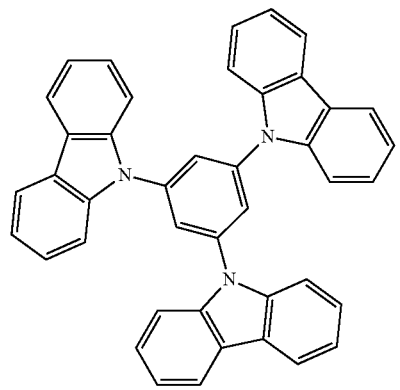
(el23) 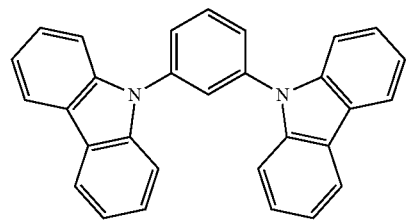

-continued
(el24)
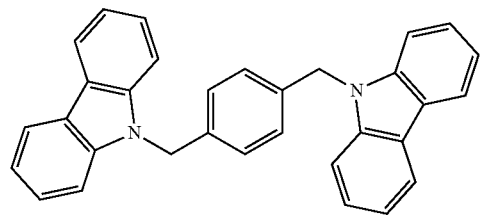
(el25)
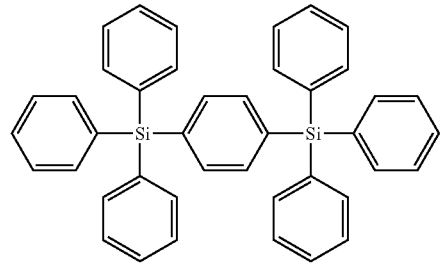
(el26)
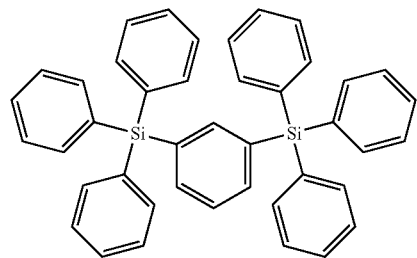
(el27)
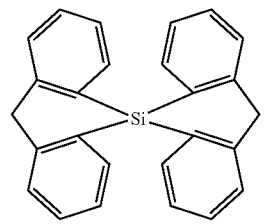
(el28)
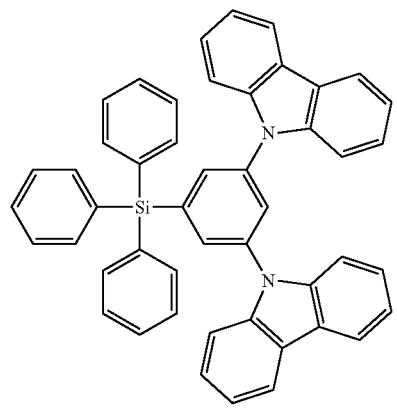
(el29)
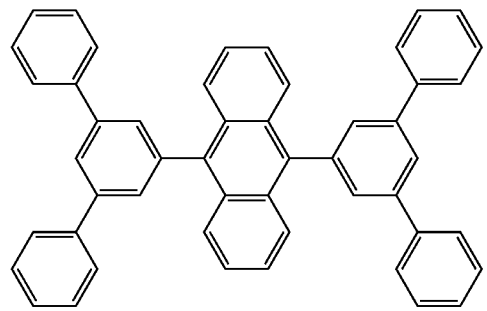
(el30)
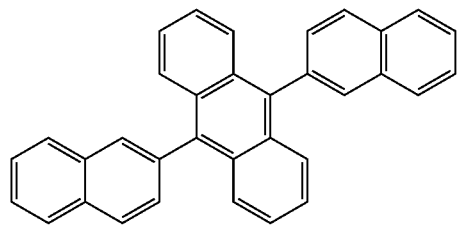
(el31)
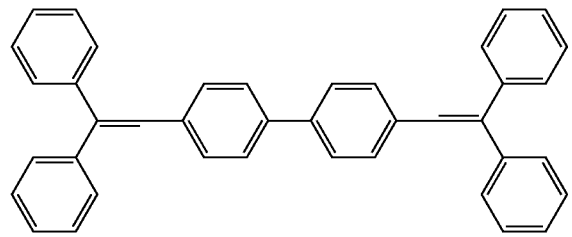

-continued
(el32)
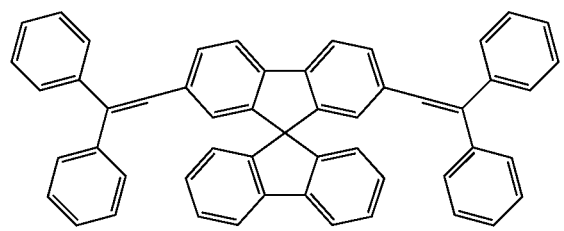
(el33)
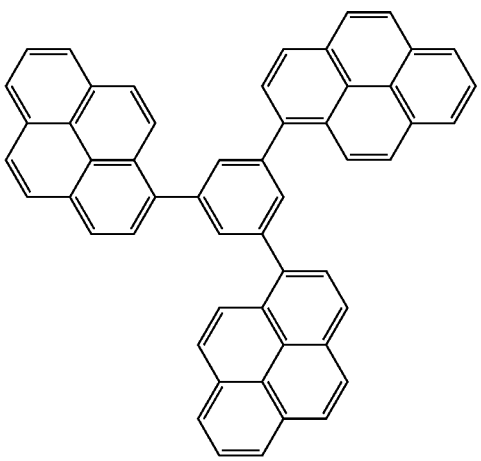
(el34)
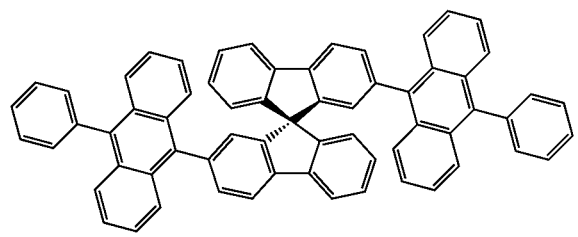
(el35)
(el36)
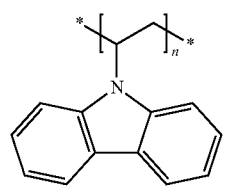
(el37)
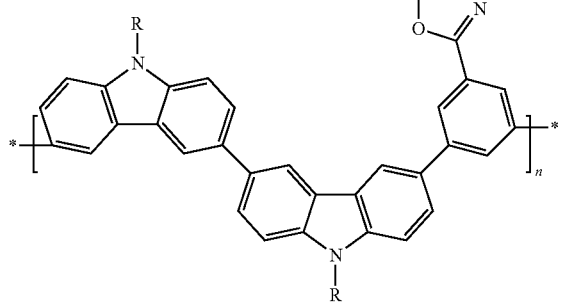
(el38)
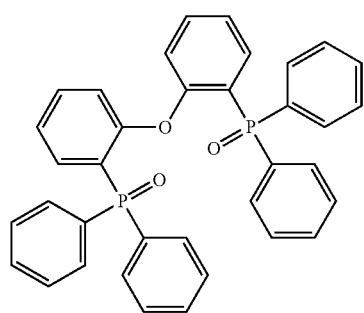

(e139)

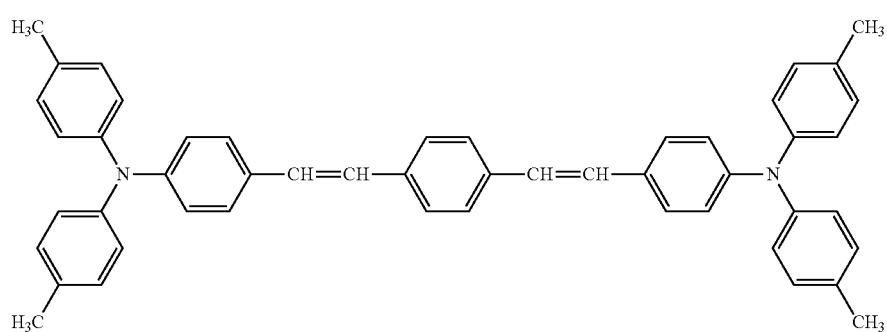

(e140)

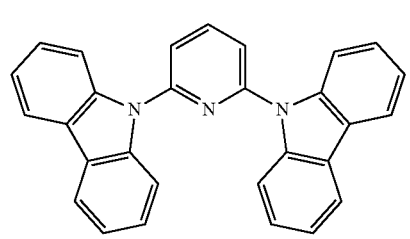

In a hole-blocking layer which is provided as needed, a compound having a hole-blocking action, such as a compound having both a bipyridyl group and an ortho-terphenyl structure, a phenanthroline derivative such as bathocuproine (hereinafter abbreviated as BCP), a metal complex of quinolinol derivative such as aluminum (III) bis (2-methyl-8 quinolinate)-4-phenylphenolate (hereinafter, abbreviated as BAlq), various rare earth complexes, an oxazole derivative, a triazole derivative, or a triazine derivative may be used. These materials may also serve as materials of the electron-transporting layer. One of the materials may be used alone, or at least two thereof may be used in combination. The hole-blocking layer may be a film of a single layer structure, or may be a film of a laminated structure. The materials may be subjected to deposition or another known method such as a spin coating method or an inkjet method to form a thin-film.

Compounds (hs1) to (hs11) which may be preferably used as hole-blocking materials are shown below.

(hs1)

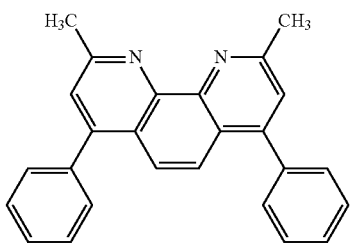

(hs2)

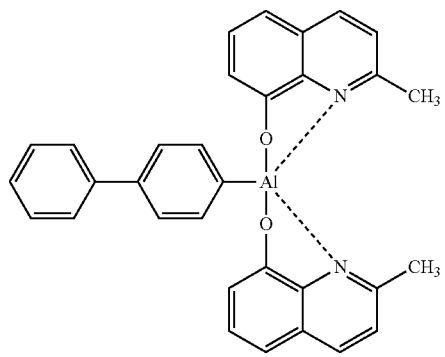

(hs3)

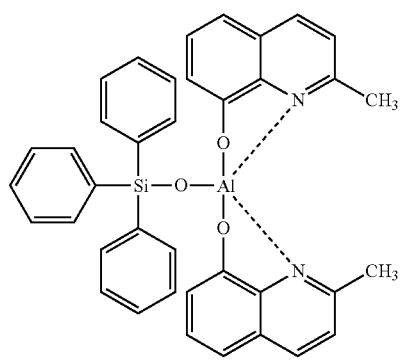

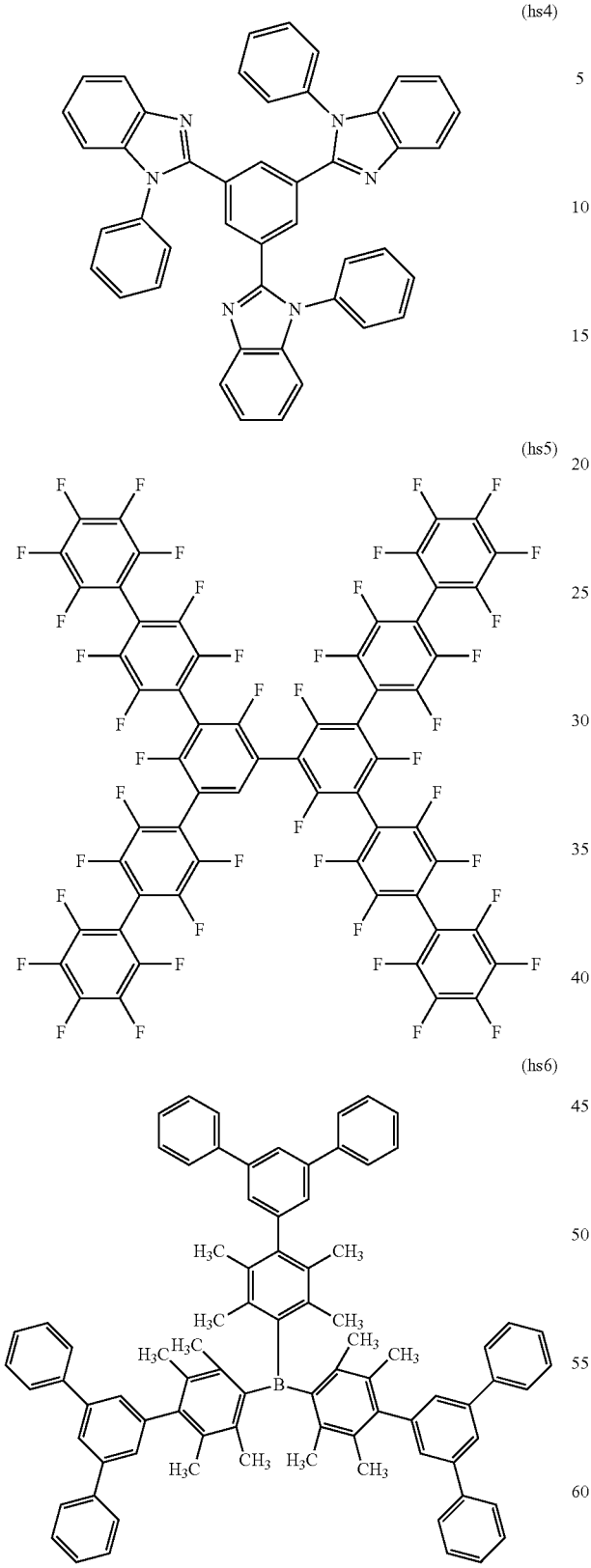
In addition to metal complexes of quinolinol derivatives such as Alq3 or BAlq, various other metal complexes, triazole derivatives, triazine derivatives, oxadiazole derivatives, thiadiazole derivatives, carbodiimide derivatives, quinoxaline derivatives, phenanthroline derivatives, or silole derivatives may be used in the electron-transporting layer which is provided as needed. One of the materials may be used alone, or at least two thereof may be used in combination. The electron-transporting layer may be a film of a single layer structure, or may be a film of a laminated structure. The materials may be subjected to deposition or another known method such as a spin coating method or an inkjet method to form a thin-film.

Although in an electron injection layer which is provided as needed, alkali metal salts such as lithium fluoride or cesium fluoride, alkaline earth metal salts such as magnesium fluoride, or metal oxides such as aluminum oxide may be used, the materials may not be contained in a preferred selection of an electron-transporting layer and a cathode.

In the electron injection layer or the electron-transporting layer, a material in which a metal such as cesium is n-doped to a material commonly used in the layer may be used.

Compounds (et1) to (et30) which are preferably used as electron-transporting materials are shown below.

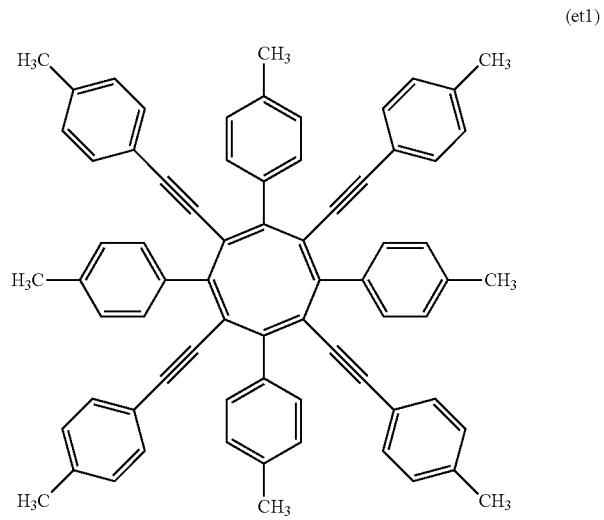
(et1)

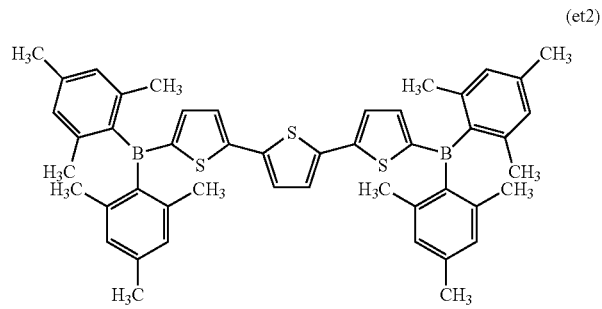
(et2)

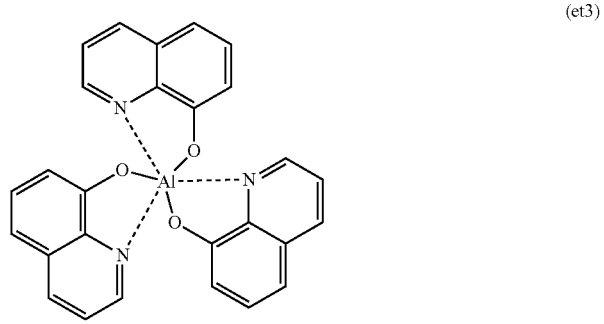
(et3)

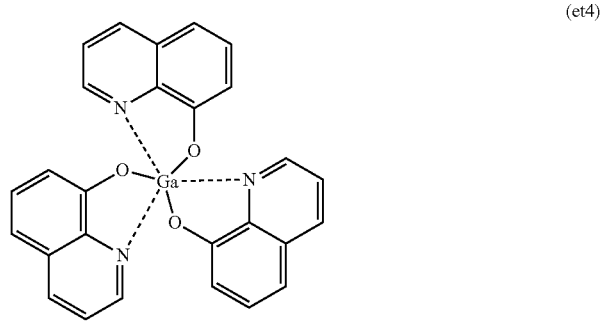
(et4)

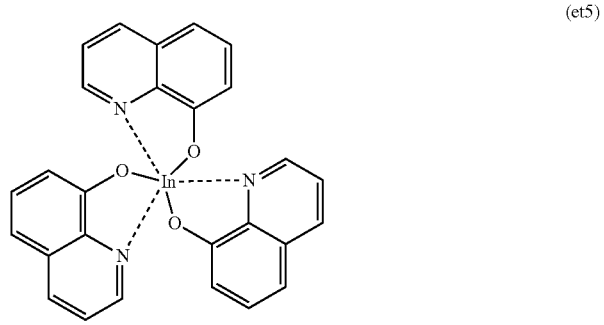
(et5)

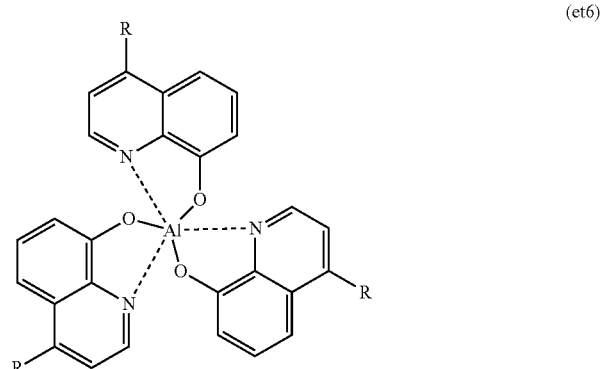
(et6)

-continued
| (et7) 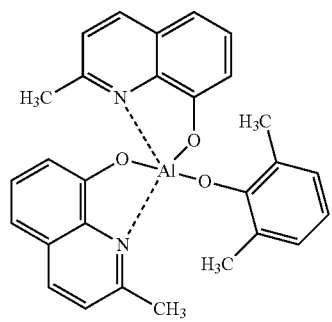 | (et8) 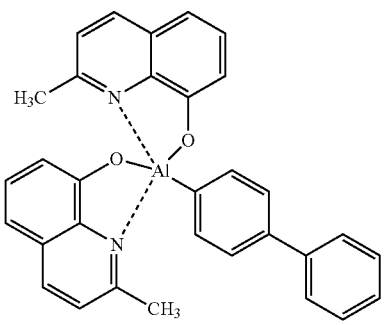 |
|---|---|
| (et9) 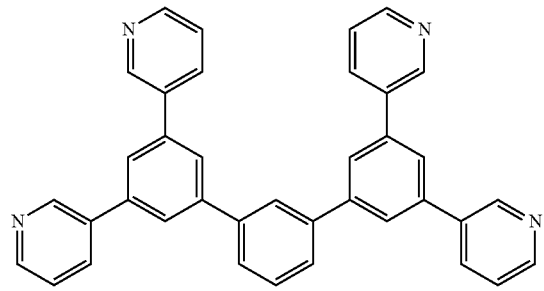 | (et10) 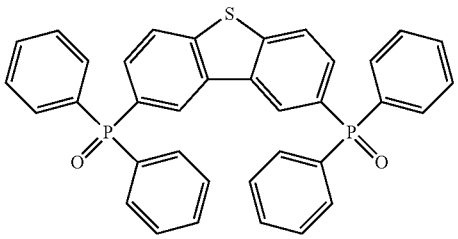 |
| (et11) 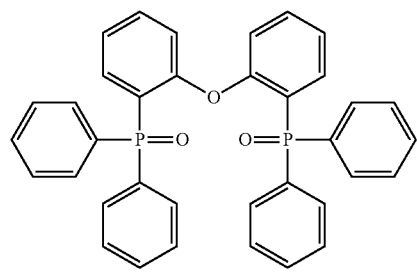 | (et12) 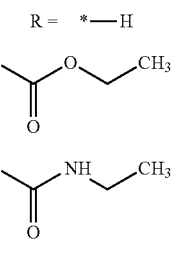 |
| (et13) 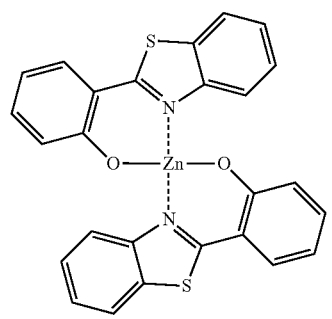 | (et14) 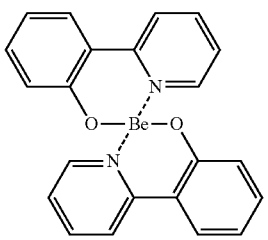 |
| (et15) 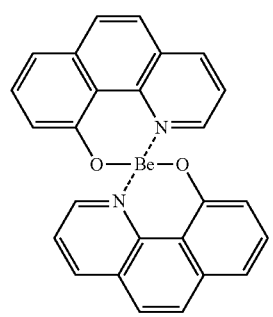 | (et16) 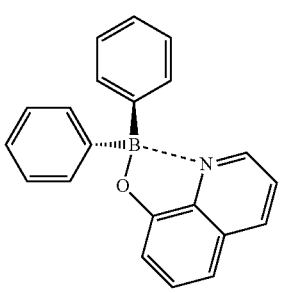 |

(et17)
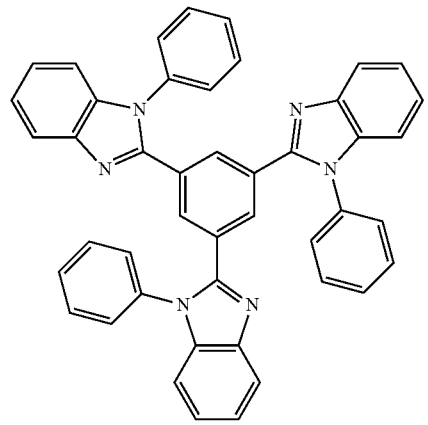
(et18)
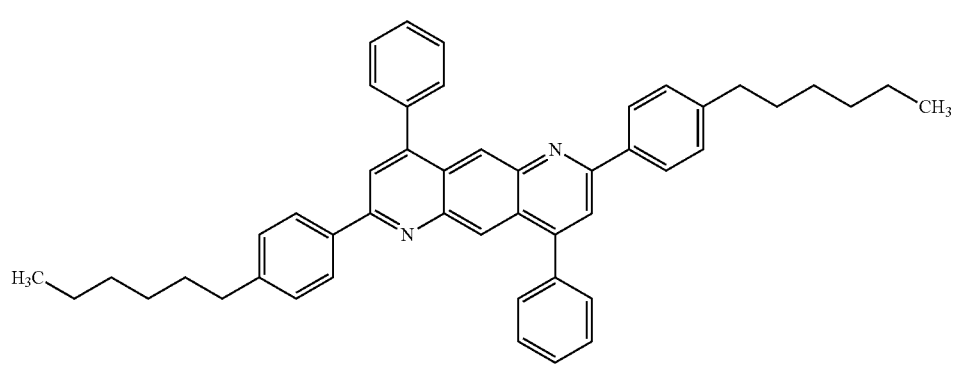
(et19)
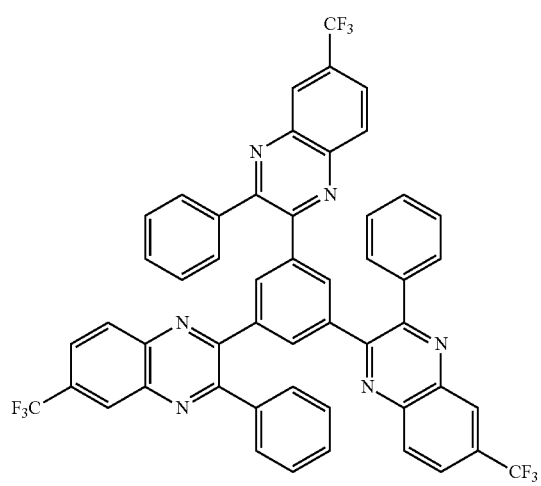
(et20)
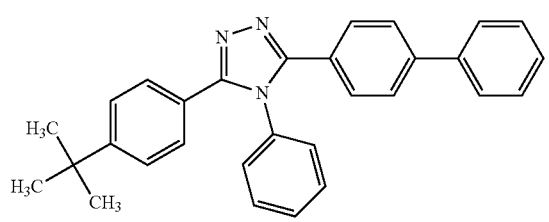

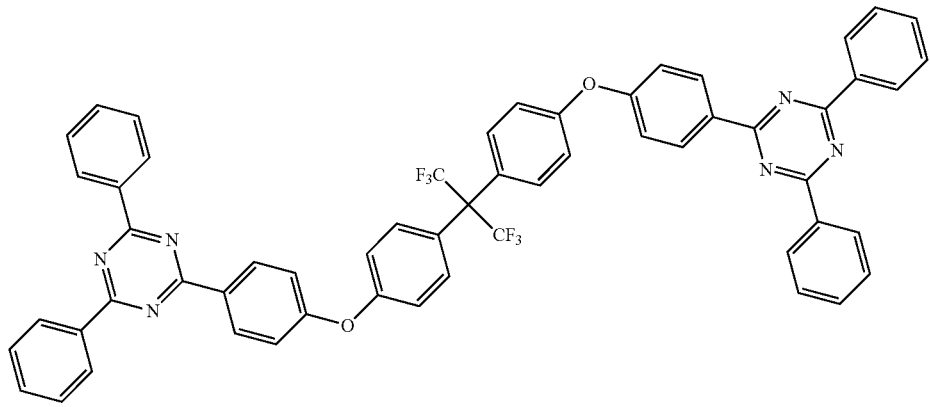
(et21)
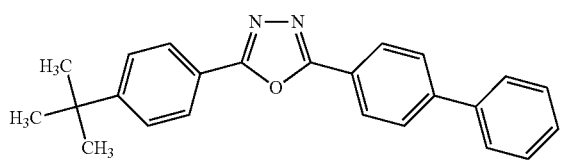
(et22)
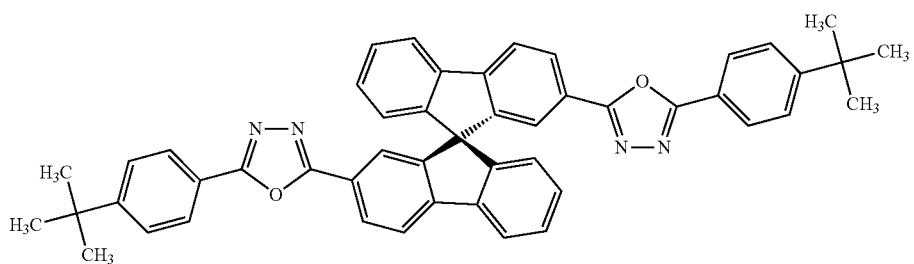
(et23)
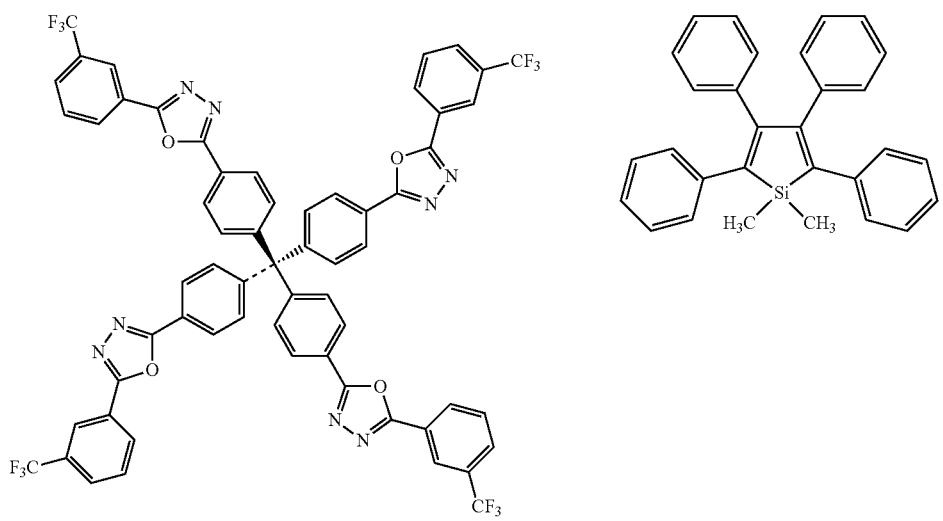
(et24)                (et25)

-continued
(et26)
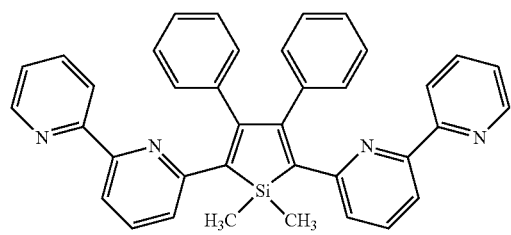
(et27)
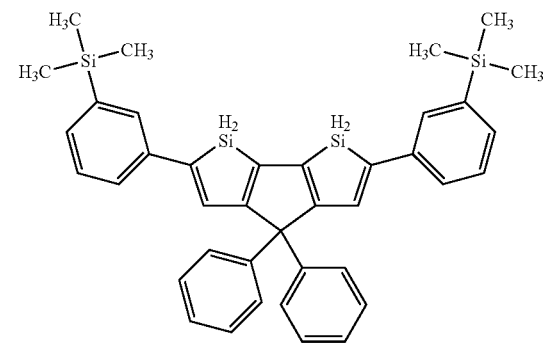
(et28)
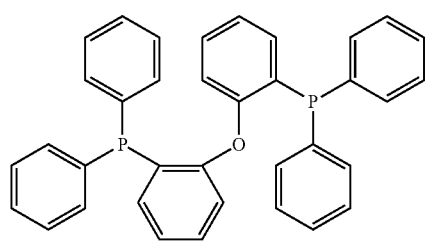
(et29)
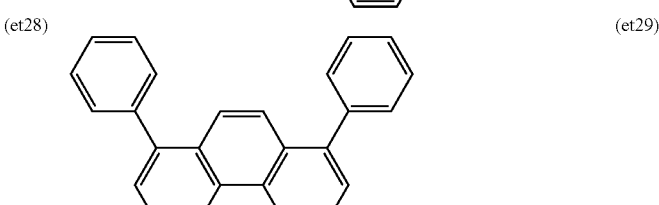
(et30)
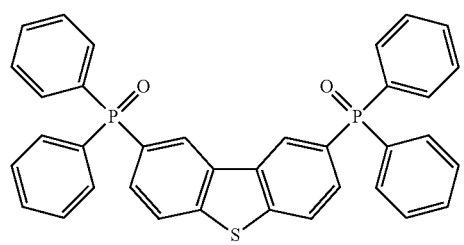
Compounds (ei1) to (ei4) which may be preferably used as electron injection materials are shown below.
(ei1)
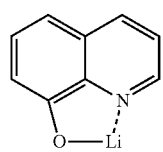
(ei4)
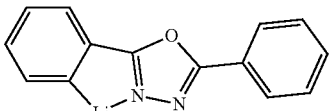
Compounds (st1) to (st5) which may be preferably used as stabilizing materials are shown below.
(ei2)
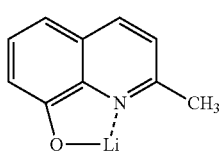
(st1)
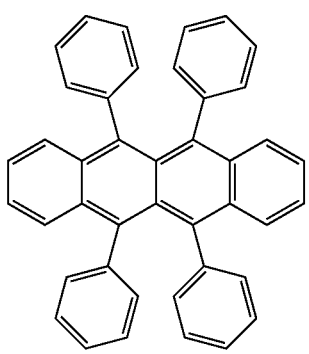
(ei3)
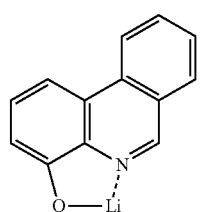

-continued (st2)
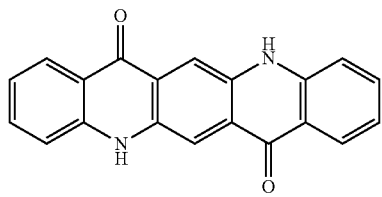

(st3)
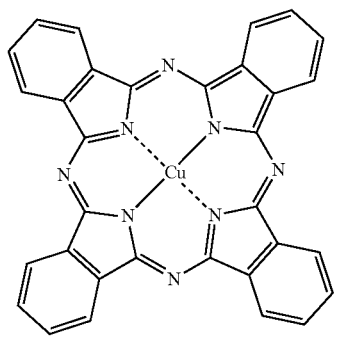

(st4)
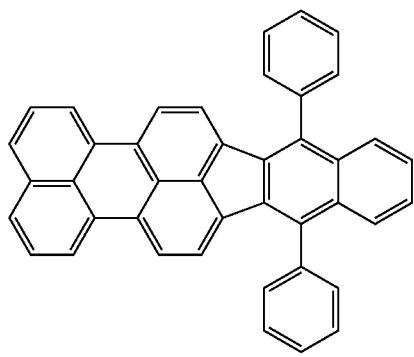

(st5)
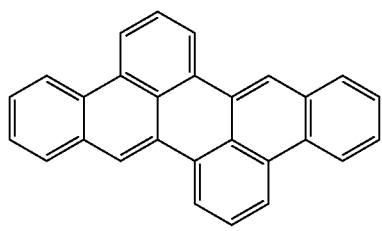

A material having a low work function is generally used in the cathode. Examples of the cathode material include sodium, an alloy of sodium and potassium, lithium, tin, magnesium, a mixture of magnesium and copper, a mixture of magnesium and aluminum, a mixture of magnesium and indium, a mixture of aluminum and aluminum oxide, indium, calcium, aluminum, silver, a mixture of lithium and aluminum, an alloy of magnesium and silver, an alloy of magnesium and indium, and an alloy of aluminum and magnesium. It is possible to obtain a transparent or semi-transparent cathode by using a transparent conductive material. The thickness of the cathode is usually 10 to 5000 nm, and preferably 50 to 200 nm. The sheet resistance of the cathode is preferably at least several hundred Ω/square.

For the purpose of protecting the cathode formed of a metal having a low work function, a layer of metal having a high work function and being stable against the atmosphere, such as aluminum, silver, nickel, chromium, gold, or platinum, is preferably laminated thereon, because the stability of the element is improved. A cathode interface layer may be provided between the cathode and an adjacent organic layer (such as an electron-transporting layer or an electron injection layer) to improve the contact therebetween. Examples of a material used in the cathode interface layer include aromatic diamine compounds, quinacridone compounds, naphthacene derivatives, organic silicon compounds, organic phosphorus compounds, compounds containing a N-phenyl carbazole skeleton, and N-vinylcarbazole polymer.

The luminescent element according to the present invention may also be applied in any of a single element, an element having a structure in which components thereof are arranged in an array configuration, and an element having a structure in which an anode and a cathode are arranged in the X-Y matrix configuration.

Effects of the embodiment according to the present invention will be shown below.

Organic photoluminescence elements and organic electroluminescent elements were prepared using the luminescent materials according to the present invention to evaluate the luminescent characteristics.

The luminescent characteristics were evaluated using SourceMeter (manufactured by Keithley Instruments: 2400 series), a spectroradiometer (manufactured by Konica Minolta Inc.: CS-2000), a fluorescence spectrophotometer (manufactured by JASCO Corporation: FP-8600), and a 100 mm Φ integrating sphere (manufactured by JASCO Corporation: ILF-835).

EXAMPLES

Example 1

Synthesis of 2,5-bis(3,6-di-tert-butyl-9H-carbazol-9-yl)isophthalonitrile (BCz-2IN-I)

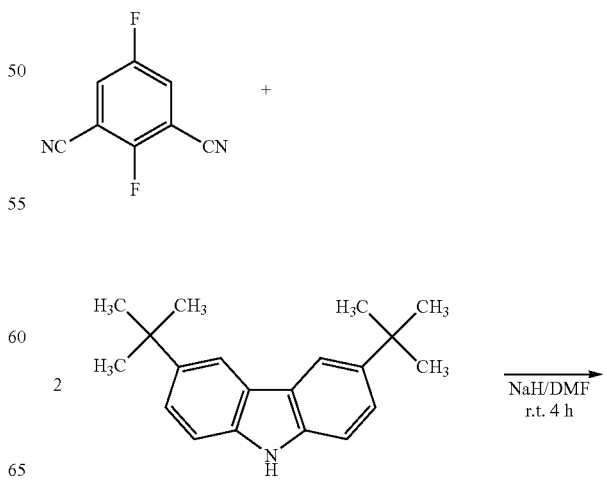

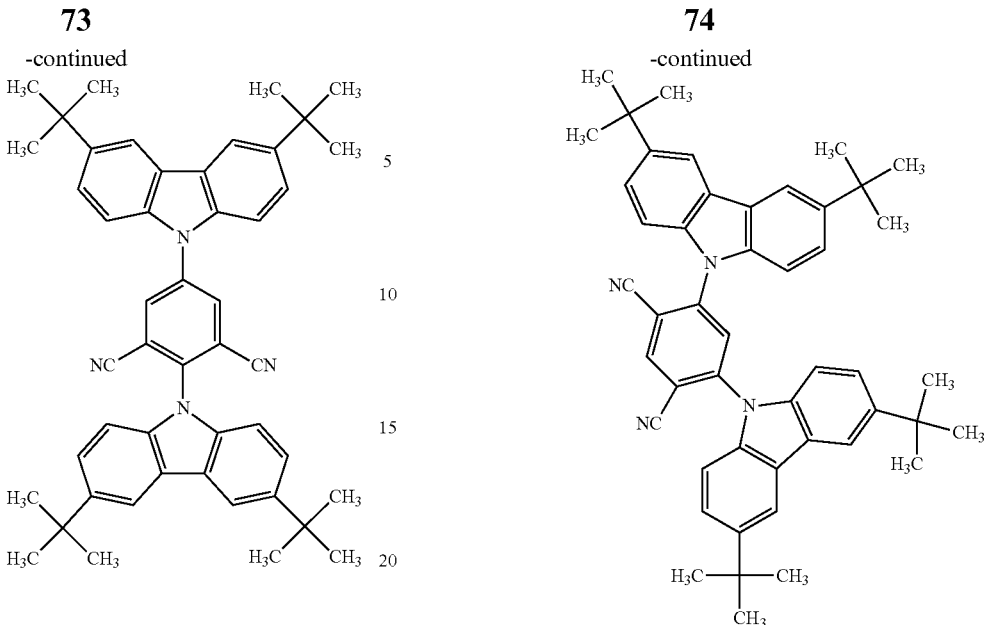

2,5-Difluoroisophthalonitrile (0.25 g, 1.52 mmol), 3,6-di-t-butylcarbazole (0.85 g, 3.04 mmol), and 5 ml of dehydrated DMF were put into a 50 mL eggplant flask, and then cooled in an ice-water bath. 60% sodium hydride (0.14 g, 3.34 mmol) was added gradually, and then the mixture was stirred at room temperature for 4 hours. The resultant reaction solution was poured into ice-water, and the precipitated crystal was collected by filtration, and then washed with n-hexane/ethyl acetate=9/1 to obtain 0.78 g of the target compound (at a yield of 75.0%).

$^1$H-NMR (400 MHz, CDCl$_3$, δ): 8.36 (s, 2H), 8.18 (t, 4H), 7.58 (dd, 2H), 7.54 (dd, 2H), 7.51 (d, 2H), 7.15 (d, 2H), 1.50 (s, 18H), 1.49 (s, 18H)

Example 2

Synthesis of 2,4-bis(3,6-di-tert-butyl-9H-carbazol-9-yl)isophthalonitrile (Abbreviated as BCz-2IN-II)

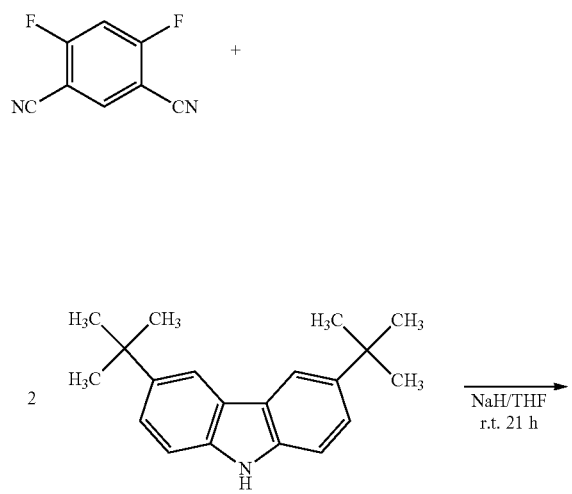

3,6-Di-t-butylcarbazole (2.92 g, 10.4 mmol) was put into a 200 mL three-necked flask in which the atmosphere was replaced with nitrogen, followed by dissolving in 30 mL of dehydrated tetrahydrofuran. Then, 60% sodium hydride (0.56 g, 14.0 mmol) was added thereto while conducting cooling with ice water, followed by stirring the mixture at room temperature for 0.5 hours. The mixture was cooled with ice water, and then 4,5-difluoroisophthalonitrile (0.57 g, 3.5 mmol) dissolved in 14 mL of dehydrated tetrahydrofuran was added thereto under nitrogen gas flow, followed by stirring the mixture at room temperature for 21 hours. The reaction solution was cooled with ice water, and then water and ethyl acetate were added thereto, followed by separating an organic layer. In addition, an aqueous layer was subjected to extraction with ethyl acetate twice, and the mixed organic layer was washed with saturated saline. The organic layer was dehydrated with magnesium sulfate, filtered and concentrated to obtain a crude product. The crude product was purified by silica gel column chromatography (eluent: n-hexane/benzene) to obtain a crude purified product. The crude purified product was washed with ethyl acetate and filtered, and then the solvent was distilled off to obtain 1.21 g of the target compound as a light yellowish-white solid at a yield of 51.0%.

$^1$H-NMR (400 MHz, CDCl$_3$, δ): 8.45 (s, 1H), 8.11 (d, J=1.2 Hz, 4H), 7.89 (s, 1H), 7.50 (dd, J=8.8 Hz, 1.6 Hz, 4H), 7.27 (d, J=8.4 Hz, 4H), 1.45 (s, 36H).

Example 3

Synthesis of 2-(3,6-di-tert-butyl-9H-carbazol-9-yl)-4,6-diphenyl-isophthalonitrile (BCz-2PIN)

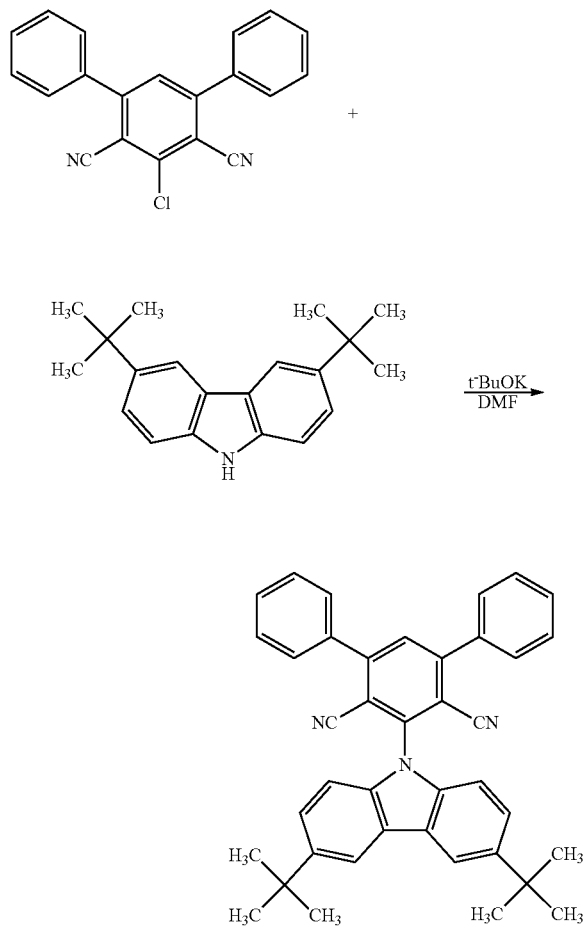

Potassium tert-butoxide (0.336 g, 3.00 mmol), dehydrated DMF (8 ml), and 3,6-di-t-butylcarbazole (0.838 g, 3.00 mmol) were put into a 50 mL schlenk flask, and then stirred at room temperature for 30 minutes. Then, 5'-chloro-[1,1': 3',1''-terphenyl]-4',6'-dicarbonitrile (0.630 g, 2.00 mmol) was added thereto, and then refluxed for 24 hours. The reaction solution was poured into water, and dichloromethane was added thereto to subject the mixture to extraction. The resultant organic layer was dried with magnesium sulfate, filtered, and concentrated with a rotary evaporator. The resultant residue was purified by column chromatography (hexane/chloroform=2/1) to obtain 0.645 g of the target compound (at a yield of 57.8%).

$^1$H-NMR (400 MHz, CDCl$_3$, δ): 8.18 (t, J=0.9 Hz, 2H), 7.83 (s, 1H), 7.71-7.75 (m, 4H), 7.52-7.60 (m, 8H), 7.18 (d, J=8.5 Hz, 2H), 1.46 (s, 18H).

$^{13}$C NMR (125 MHz, CDCl$_3$, δ): 151.12, 146.17, 144.246, 138.75, 136.19, 130.88, 130.2, 135.66, 134.14, 125.09, 124.59, 124.20, 123.37, 122.15, 117.63, 116.21, 115.51, 115.07, 112.35, 109.89, 109.10, 109.04, 35.09, 34.70, 34.42, 32.17, 31.88.

Example 4

In a glove box under a nitrogen atmosphere, toluene solutions of BCz-2PIN, BCz-2IN-I, and BCz-2IN-II (in an amount of 10$^{-5}$ M) were prepared as luminescent materials. PL spectra of these luminescent materials were measured. The results are shown in FIG. 1.

Example 5

A HAT-CN (dipyrazino[2,3-F:2',3'-H]quinoxaline-2,3,6,7,10,11-hexacarbonitrile) layer having a thickness of 10 nm, a TAPC (di-[4-(N,N-ditolyl-amino)-phenyl]cyclohexane) layer having a thickness of 40 nm, a CCP (1,4-bis(carbazolyl)benzene) layer having a thickness of 10 nm, a mCP (1,3-bis(N-carbazolyl)benzene) layer having a thickness of 10 nm, a luminescent layer having a thickness of 20 nm, a PPF (2,8-bis(diphenylphosphine oxide)dibenzofuran) layer having a thickness of 10 nm, and a B3PyPBM (1,3-bis(3,5-dipyrid-3-yl-phenyl)benzene) layer having a thickness of 40 nm were laminated in this order by conducting vacuum evaporation (at 5.0×10$^{-4}$ Pa or less) on a glass substrate on which an anode made of indium tin oxide (ITO) was formed with a thickness of 50 nm. Then, an 8-hydroxy quinolinato lithium film having a thickness of 1 nm, and an aluminum film having a thickness of 100 nm were laminated in this order by a vacuum deposition method to form a cathode, and thus an organic electroluminescence element was obtained.

BCz-2PIN, BCz-IN-I, or BCz-IN-II was used as a doping material of the luminescent layer. The concentration of the doping material was set to be 20% by weight (in PPF).

Figure 2:
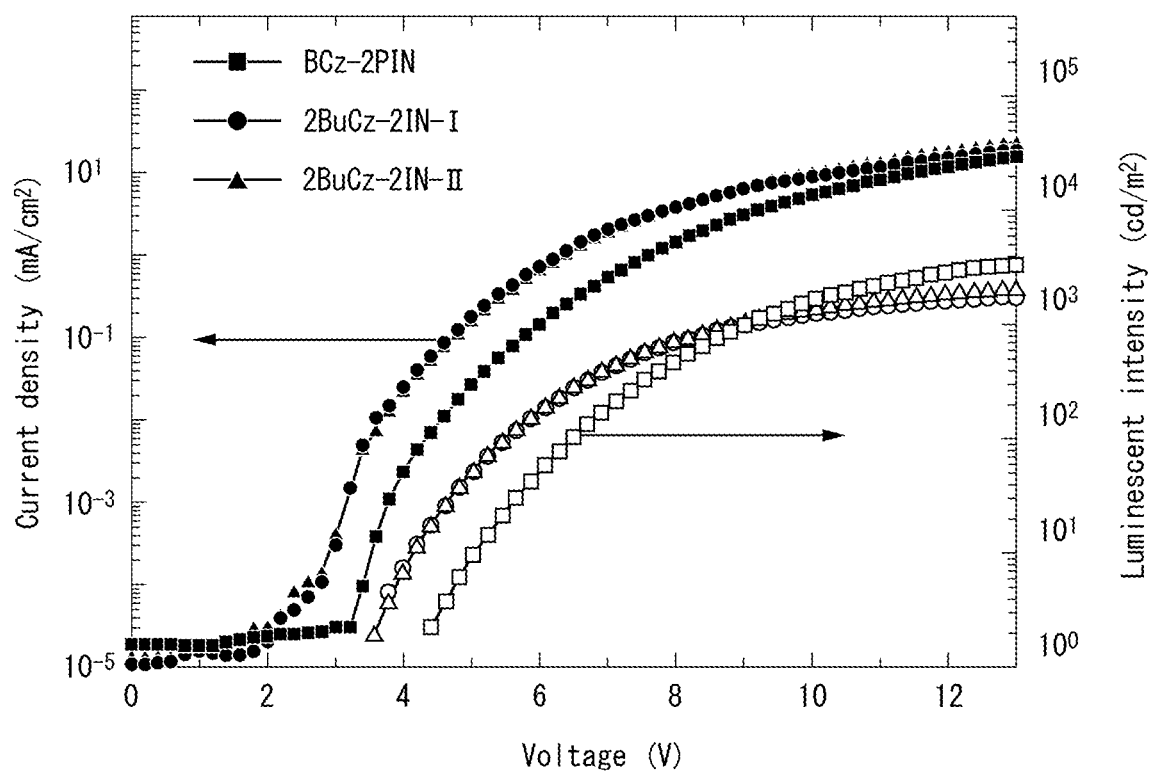
FIG. 2 is a drawing that indicates voltage-current density characteristics of organic electroluminescent elements prepared in Example 5.
Figure 3:
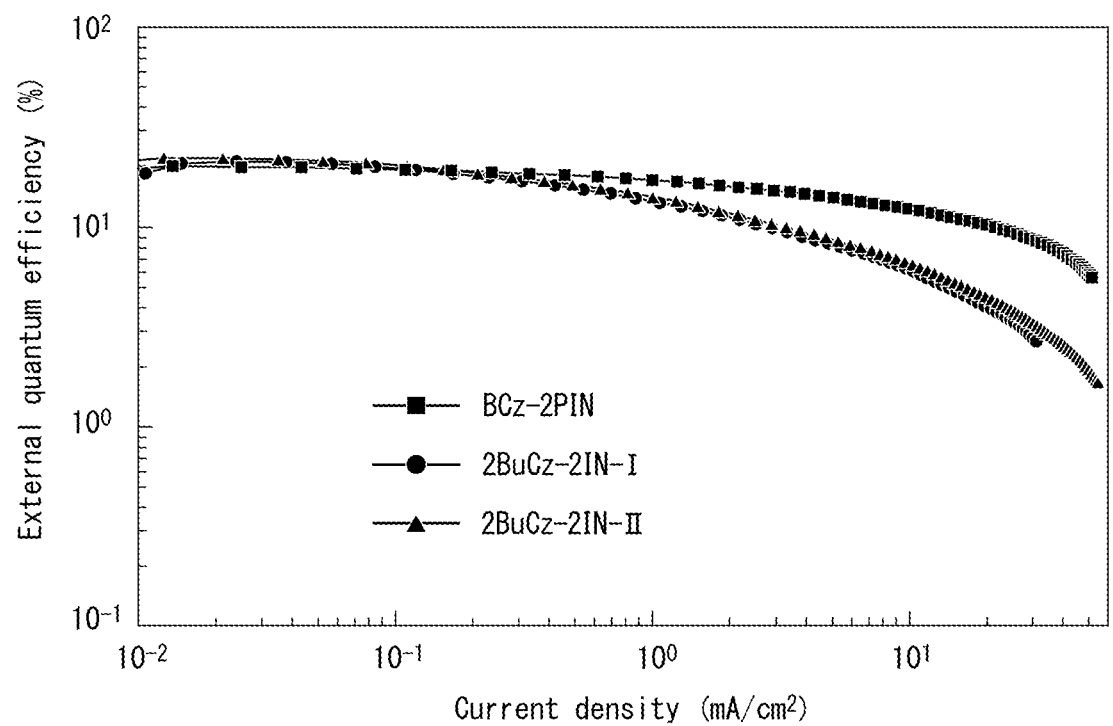
FIG. 3 is a drawing that indicates current density-external quantum efficiency characteristics of organic electroluminescent elements prepared in Example 5.

The characteristics of the organic electroluminescent element were measured. The voltage-current density-luminescent intensity characteristics are shown in FIG. 2. In FIG. 2, black marks indicate current density, and white marks indicate luminescent intensity. The current density-external quantum efficiency characteristics are shown in FIG. 3. Other results are shown in Table 1.

TABLE 1

| Compound in luminescent layer | λ$_{EL}$ [nm] | λ$_{FWHM}$ [nm] | E$_{FWHM}$ [eV] | Von [V] | L$_{max}$ [cdm$^{-2}$] | EQE Max [%] | EQE 100 cdm$^{-2}$ [%] | EQE 1000 cdm$^{-2}$ [%] | CE$_{max}$ [cdA$^{-1}$] | PE$_{max}$ [1 mW$^{-1}$] | CIE (x, y) |
|---|---|---|---|---|---|---|---|---|---|---|---|
| BCz-2PIN | 497 | 83 | 0.41 | 4.2 | 3629 | 21.1 | 20.3 | 16.0 | 54.5 | 38.4 | (0.20, 0.44) |
| 2BCz-2IN-I | 494 | 78 | 0.39 | 3.4 | 2023 | 21.0 | 17.7 | 7.8 | 43.0 | 37.1 | (0.18, 0.39) |
| 2BCz-2IN-I1 | 497 | 79 | 0.4 | 3.4 | 2357 | 21.7 | 17.4 | 8.1 | 44.6 | 21.7 | (0.19, 0.40) |

Example 6

Synthesis of 2-(3-(9-phenyl-9H-carbazol-3-yl)-9H-carbazol-9-yl)-4,6-diphenyl-isophthalonitrile (Ph-BiCz-PIN)

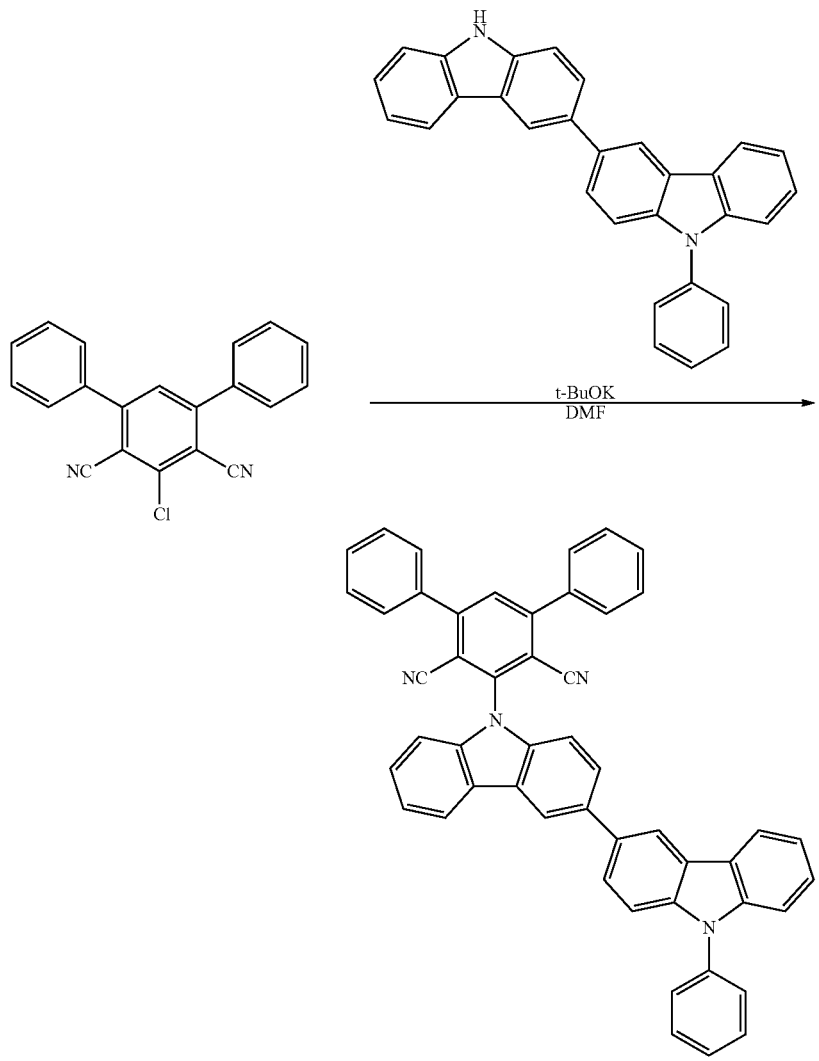

t-BuOK (0.168 g, 1.50 mmol), dehydrated DMF (8 ml), and 9-phenyl-9H,9'H-3,3'-bicarbazole (0.612 g, 1.50 mmol) were put into a 50 mL schlenk flask, and then stirred at room temperature for 30 minutes. Then, 5'-chloro-[1,1':3',1''-terphenyl]-4',6'-dicarbonitrile (0.314 g, 1.00 mmol) was added thereto and then refluxed for 24 hours. The reaction solution was poured into water, and then dichloromethane was added thereto, followed by subjecting the mixture to extraction. The resultant organic layer was dried with magnesium sulfate, filtered, and concentrated by a rotary evaporator. The resultant residue was purified by column chromatography (hexane/chloroform=8/1) to obtain 0.482 g of Ph-BiCz-PIN (at a yield of 70.2%).

$^1$H-NMR (400 MHz, CDCl$_3$, δ): 8.47 (d, J=1.8 Hz, 2H), 8.26 (dd, J=8.5, 7.8 Hz, 2H), 7.87 (s, 1H), 7.84 (dd, J=8.4, 1.9 Hz, 1H), 7.78 (dd, J=8.5, 1.8 Hz, 1H), 7.75-7.73 (m, 4H), 7.65-7.62 (m, 4H), 7.60-7.31 (m, 15H)

Example 7

Synthesis of 2-(3-(9-(4,6-diphenylisophthalonitril-2-yl)-9H-carbazol-3-yl)-9H-carbazol-9-yl)-4,6-diphenyl-isophthalonitrile (BiCz-2PIN)

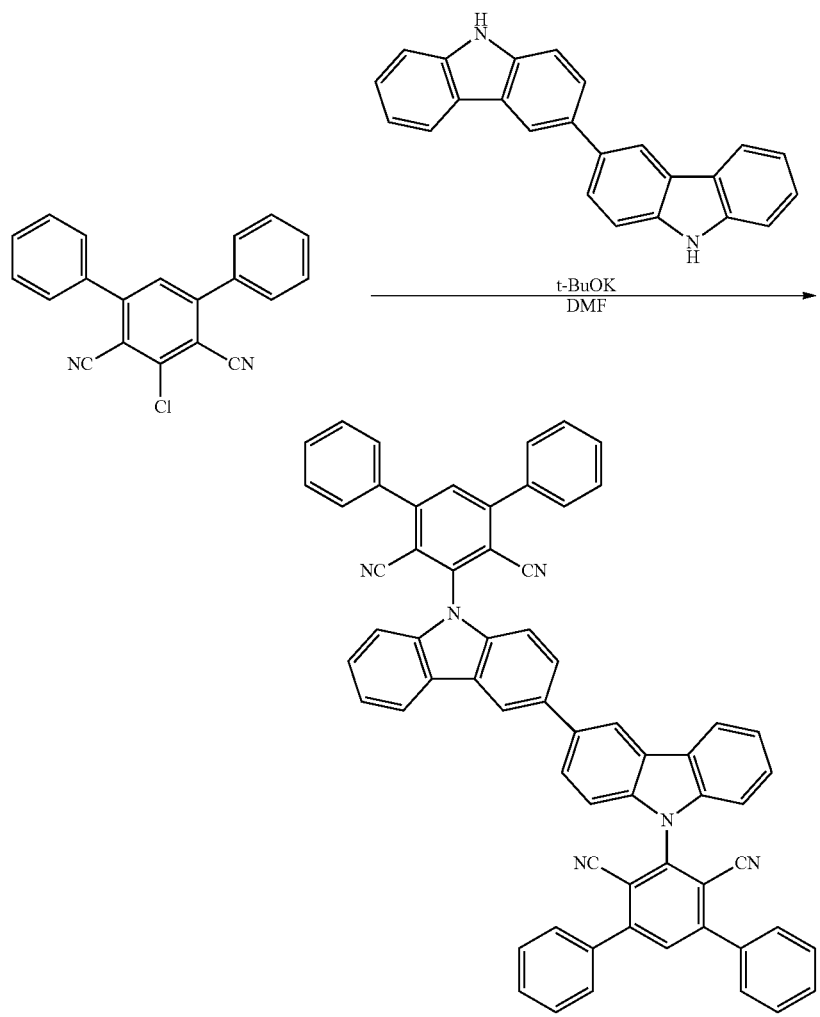

t-BuOK (0.224 g, 2.00 mmol), dehydrated DMF (10 ml), and 9H,9'H-3,3'-bicarbazole (0.332 g, 1.00 mmol) were put into a 50 mL schlenk flask, and then stirred at room temperature for 30 minutes. Then, 5'-chloro-[1,1':3',1''-terphenyl]-4',6'-dicarbonitrile (0.628 g, 2.00 mmol) was added thereto and then refluxed for 24 hours. The reaction solution was poured into water, and then dichloromethane was added thereto, followed by subjecting the mixture to extraction. The resultant organic layer was dried with magnesium sulfate, filtered, and concentrated by a rotary evaporator. The resultant residue was purified by column chromatography (hexane/chloroform=4/1) to obtain 0.350 g of BiCz-2PIN (at a yield of 39.0%).

$^1$H-NMR (400 MHz, CDCl$_3$, δ): 8.47 (d, J=1.3 Hz, 2H), 8.26 (d, J=7.8 Hz, 2H), 7.87 (s, 2H), 7.83 (dd, J=8.4, 1.9 Hz, 2H), 7.75-7.72 (m, 8H), 7.61-7.50 (m, 14H), 7.43-7.35 (m, 4H), 7.28 (d, J=8.0 Hz, 2H)

Example 8

Synthesis of 2-(3,6-di-phenyl-9H-carbazol-9-yl)-4,6-diphenyl-isophthalonitrile (PCz-PIN)

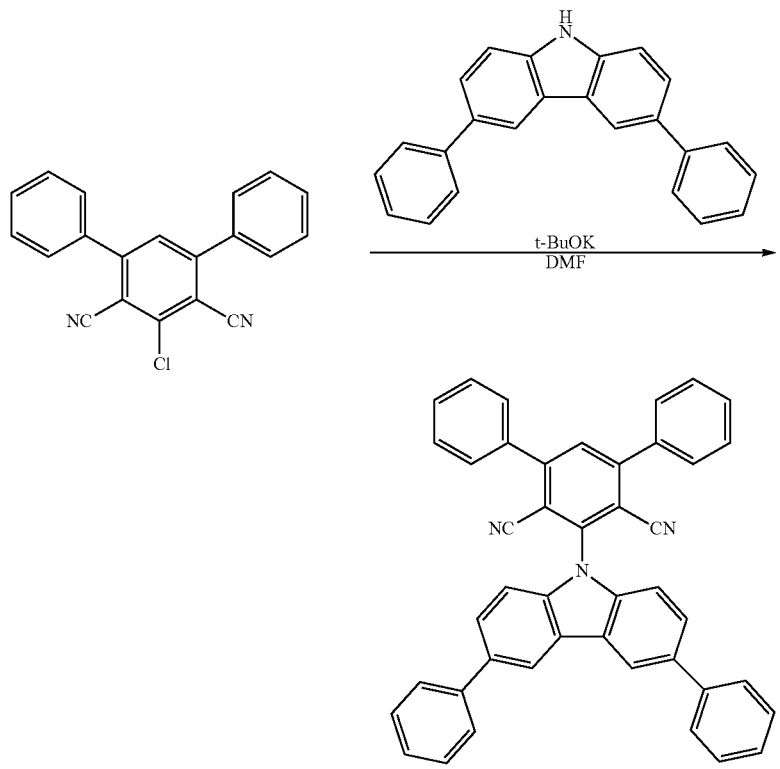

t-BuOK (0.672 g, 6.00 mmol), dehydrated DMF (16 ml), and 3,6-diphenylcarbazole (1.914 g, 6.00 mmol) were put into a 50 mL schlenk flask, and then stirred at room temperature for 30 minutes. Then, 5'-chloro-[1,1':3',1''-terphenyl]-4',6'-dicarbonitrile (0.942 g, 3.00 mmol) was added thereto and then refluxed for 24 hours. The reaction solution was poured into water, and then dichloromethane was added thereto, followed by subjecting the mixture to extraction. The resultant organic layer was dried with magnesium sulfate, filtered, and concentrated by a rotary evaporator. The resultant residue was purified by column chromatography (hexane/chloroform=4/1) to obtain 0.956 g of PCz-PIN (at a yield of 53.4%).

$^1$H-NMR (400 MHz, CDCl$_3$, δ): 8.41 (d, J=1.3 Hz, 2H), 7.88 (s, 1H), 7.75-7.71 (m, 10H), 7.61-7.47 (m, 10H), 7.39-7.31 (m, 4H)

Example 9

Figure 4:
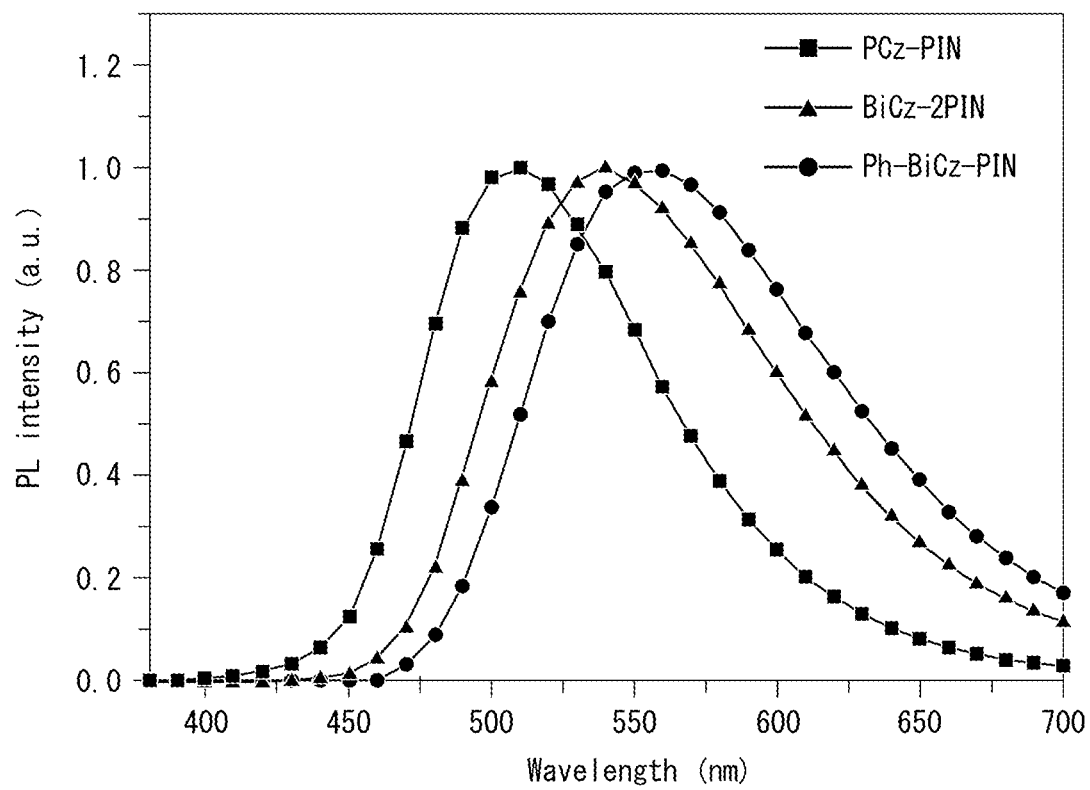
FIG. 4 is a drawing that indicates PL spectra of toluene solutions prepared in Example 9.

In a glove box under a nitrogen atmosphere, toluene solutions of Ph-BiCz-PIN, BiCz-2PIN, and PCz-PIN (in an amount of 10$^{-5}$ M) were prepared as luminescent materials. PL spectra of these luminescent materials were measured. The results are shown in FIG. 4.

Example 10

A HAT-CN layer having a thickness of 10 nm, a TAPC layer having a thickness of 40 nm, a CCP layer having a thickness of 10 nm, a mCP layer having a thickness of 10 nm, a luminescent layer having a thickness of 20 nm, a PPF layer having a thickness of 10 nm, and a B3PyPBM layer having a thickness of 40 nm were laminated in this order by conducting vacuum evaporation (at 5.0×10$^{-4}$ Pa or less) on a glass substrate on which an anode made of indium tin oxide (ITO) was formed with a thickness of 50 nm. Then, an 8-hydroxy quinolinato lithium film having a thickness of 1 nm, and an aluminum film having a thickness of 100 nm were laminated in this order by a vacuum deposition method to form a cathode, and thus an organic electroluminescence element was obtained.

Ph-BiCz-PIN, BiCz-2PIN, or PCz-PIN was used as a doping material of the luminescent layer. The concentration of the doping material was set to be 20% by weight (in PPF).

Figure 5:
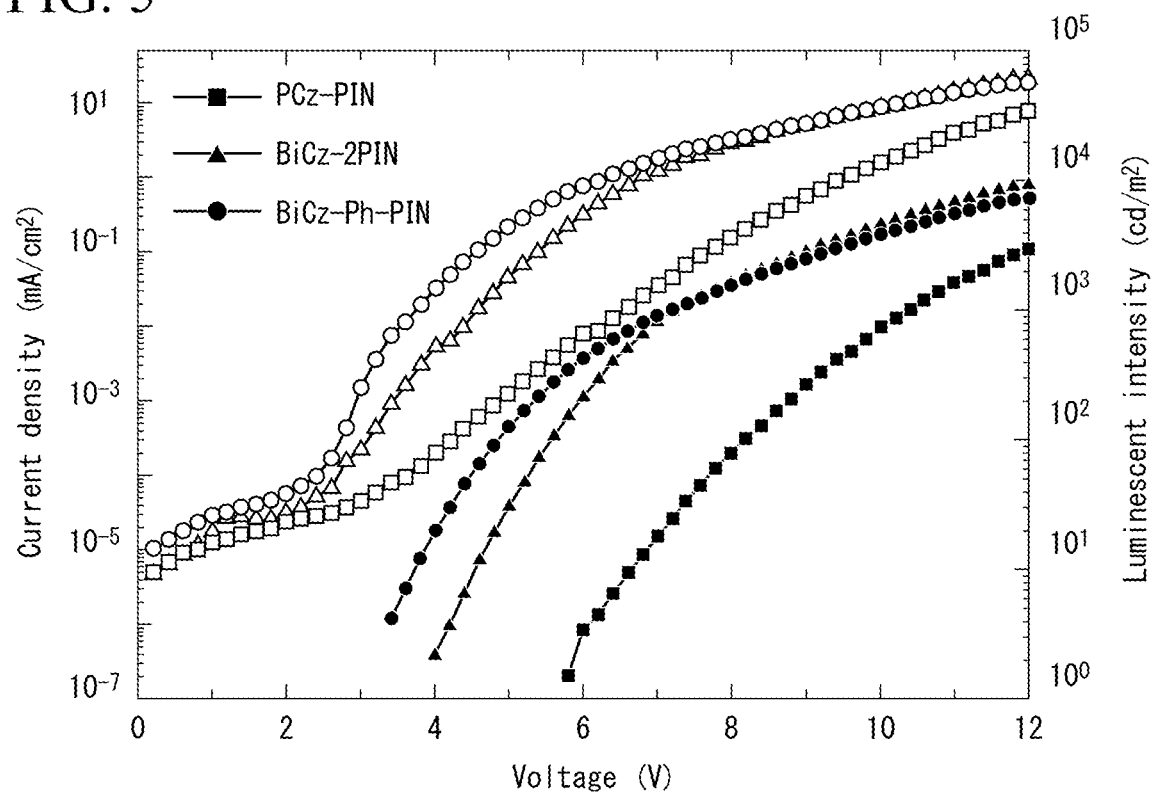
FIG. 5 is a drawing that indicates voltage-current density characteristics of organic electroluminescent elements prepared in Example 10.
Figure 6:
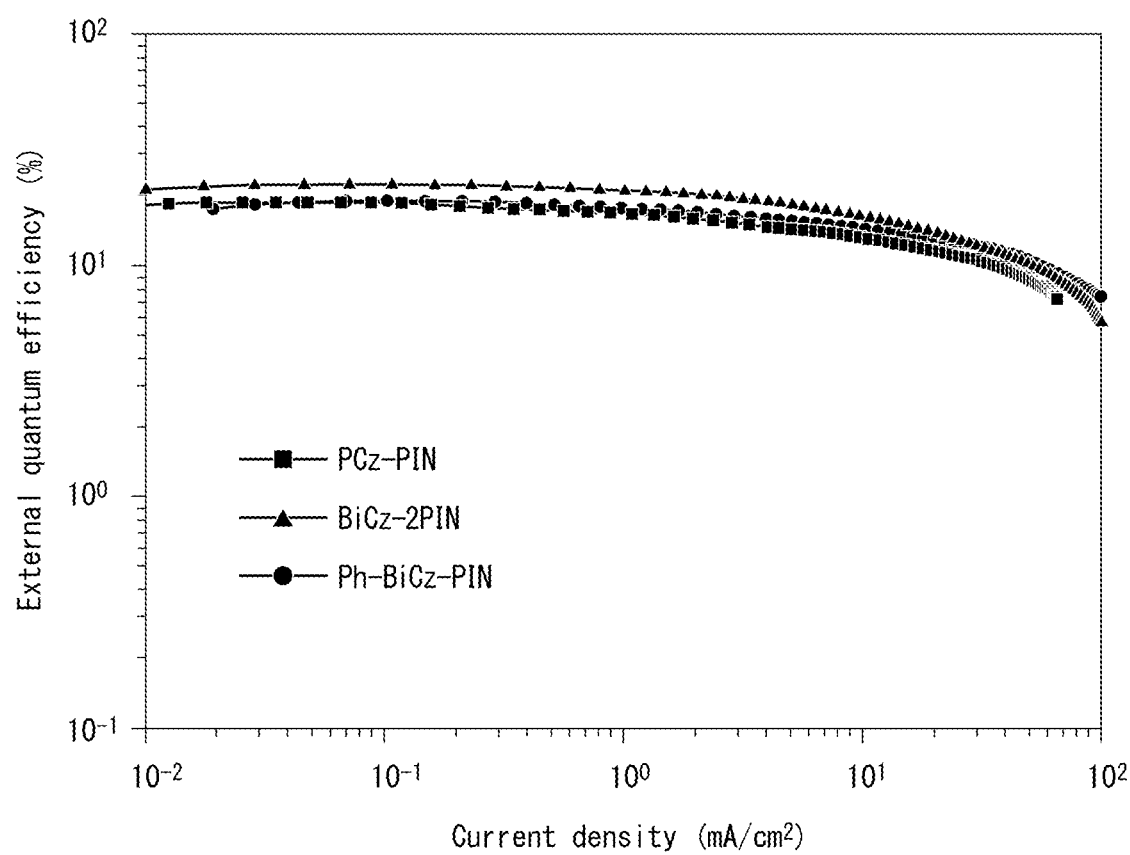
FIG. 6 is a drawing that indicates current density-external quantum efficiency characteristics of organic electroluminescent elements prepared in Examples 6 to 8.

The characteristics of the organic electroluminescent element were measured. The voltage-current density-luminescent intensity characteristics are shown in FIG. 5. In FIG. 5, black marks indicate current density, and white marks indicate luminescent intensity. The current density-external quantum efficiency characteristics are shown in FIG. 6. Other results are shown in Table 2.

TABLE 2

| Compound in luminescent layer | $\lambda_{EL}$ [nm] | $\lambda_{FWHM}$ [nm] | $V_{on}$ [V] | $L_{max}$ [cdm$^{-2}$] | EQE Max [%] | EQE 100 cdm$^{-2}$ [%] | EQE 1000 cdm$^{-2}$ [%] | $CE_{max}$ [cdA$^{-1}$] | $PE_{max}$ [1 mW$^{-1}$] | CIE (x, y) |
|---|---|---|---|---|---|---|---|---|---|---|
| PCz-PIN | 502 | 84 | 6.0 | 13862 | 18.7 | 17.7 | 15.3 | 51.2 | 25.3 | (0.23, 0.48) |
| BiCz-2PIN | 533 | 99 | 4.0 | 18276 | 22.0 | 21.5 | 20.1 | 67.6 | 46.0 | (0.30, 0.55) |
| Ph-BiCz-PIN | 526 | 102 | 3.4 | 17980 | 18.7 | 18.1 | 16.3 | 60.2 | 40.4 | (0.35, 0.56) |

Thus, a luminescent material containing the compound according to the present invention exhibited high luminescent characteristics.

INDUSTRIAL APPLICABILITY

The isophthalonitrile compound according to the present invention is useful as a luminescent material. The luminescent element containing the luminescent material according to the present invention can achieve excellent luminescent efficiency.

The invention claimed is:

1. A compound represented by formula (II-2)):

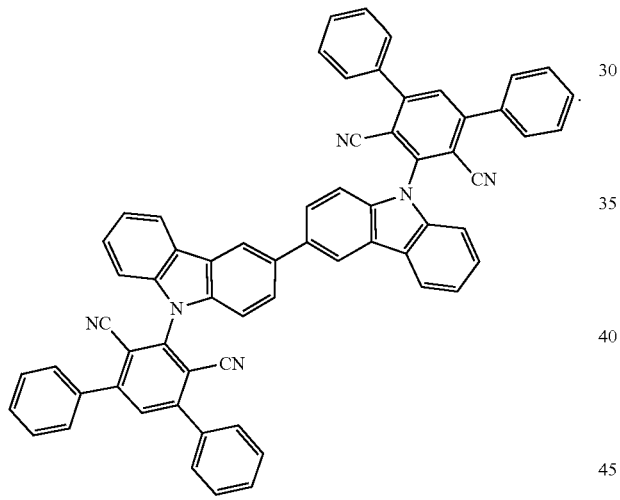

(II-2)

2. A luminescent material comprising the compound of claim 1.

3. A luminescent element comprising the luminescent material of claim 2.

* * * * *